US012727072B2

(12) United States Patent
Kitasaka et al.

(10) Patent No.: US 12,727,072 B2
(45) Date of Patent: Sep. 1, 2026

(54) EUV LIGHT GENERATION SYSTEM AND ELECTRONIC DEVICE MANUFACTURING METHOD

(71) Applicant: GIGAPHOTON INC., Tochigi (JP)

(72) Inventors: Shogo Kitasaka, Tochigi (JP); Yuichi Nishimura, Tochigi (JP); Takayuki Yabu, Tochigi (JP)

(73) Assignee: GIGAPHOTON INC., Tochigi (JP)

( * ) Notice: Subject to any disclaimer, the term of this patent is extended or adjusted under 35 U.S.C. 154(b) by 566 days.

(21) Appl. No.: 18/305,946

(22) Filed: Apr. 24, 2023

(65) Prior Publication Data

US 2023/0413411 A1 Dec. 21, 2023

(30) Foreign Application Priority Data

Jun. 16, 2022 (JP) ................................ 2022-097474

(51) Int. Cl.
*H05G 2/00* (2006.01)
*G03F 7/00* (2006.01)

(52) U.S. Cl.
CPC ....... *H05G 2/0086* (2024.08); *G03F 7/70033* (2013.01)

(58) Field of Classification Search
CPC .......................... H05G 2/0086; G03F 7/70033
See application file for complete search history.

(56) References Cited

U.S. PATENT DOCUMENTS 9,823,572 B2 * 11/2017 Nikipelov ............ G02B 26/023
10,842,010 B2 11/2020 Yabu et al.
2006/0114958 A1 6/2006 Trintchouk et al.
2018/0199422 A1 7/2018 Yabu

OTHER PUBLICATIONS

A Search Report issued by the Netherlands Patent Office on Jan. 12, 2024, which corresponds to the Netherlands Application No. 2034792 and is related to U.S. Appl. No. 18/305,946.

* cited by examiner

*Primary Examiner* — Georgia Y Epps
*Assistant Examiner* — Hanway Chang
(74) *Attorney, Agent, or Firm* — Studebaker Brackett PLLC

(57) ABSTRACT

An EUV light generation system includes a chamber, a target supply device supplying a target to a plasma generation region in the chamber, a laser device outputting pulse laser light, a beam sensor measuring one of a position and an angle of an optical axis of the pulse laser light as a first optical characteristic, a first reflection control mirror whose angle is controlled, and a processor controlling the laser device. The processor calculates a first corrected angle based on a first attenuation curve defined by the angle of the first reflection control mirror at an end of an immediately preceding irradiation period, the angle of the first reflection control mirror at a cold state, an elapsed time from a start of the pause period, and a first time constant, and to change the angle of the first reflection control mirror to the first corrected angle, during a pause period.

14 Claims, 16 Drawing Sheets

LASER LIGHT TRANSMISSION DEVICE
LASER DEVICE
PROCESSOR
EXTERNAL APPARATUS
1
11
2
3
4
5
6
21
23
24
25
27
28
29
31
32
33
50
60
291
293
IF
R1

FIG. 5
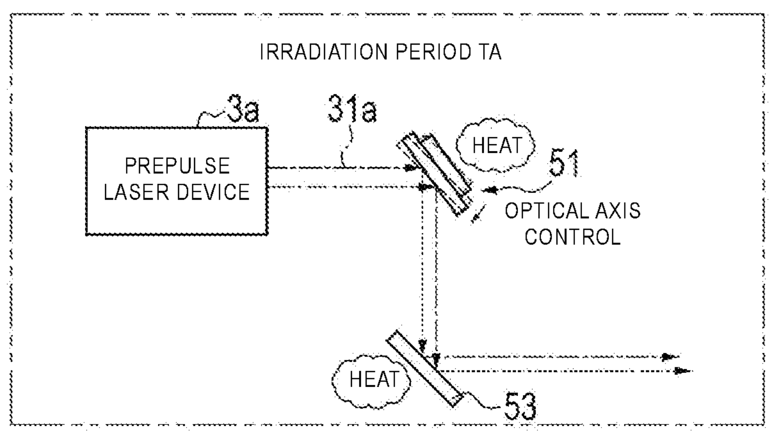
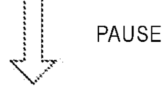
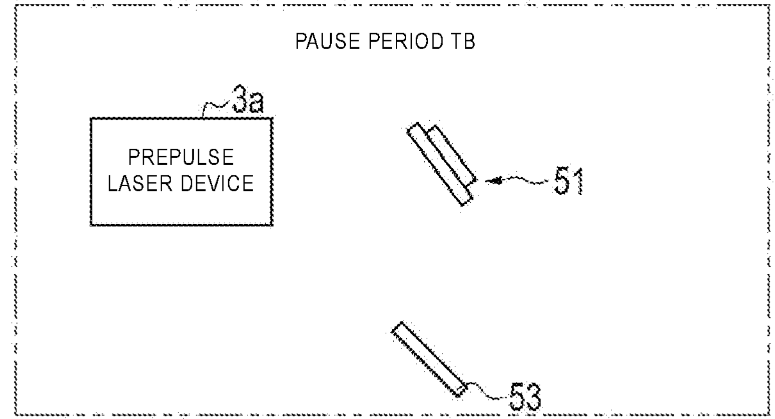
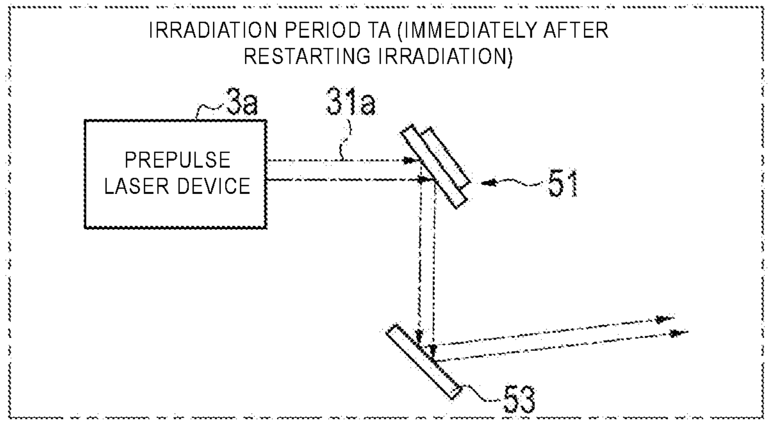

FIG. 7

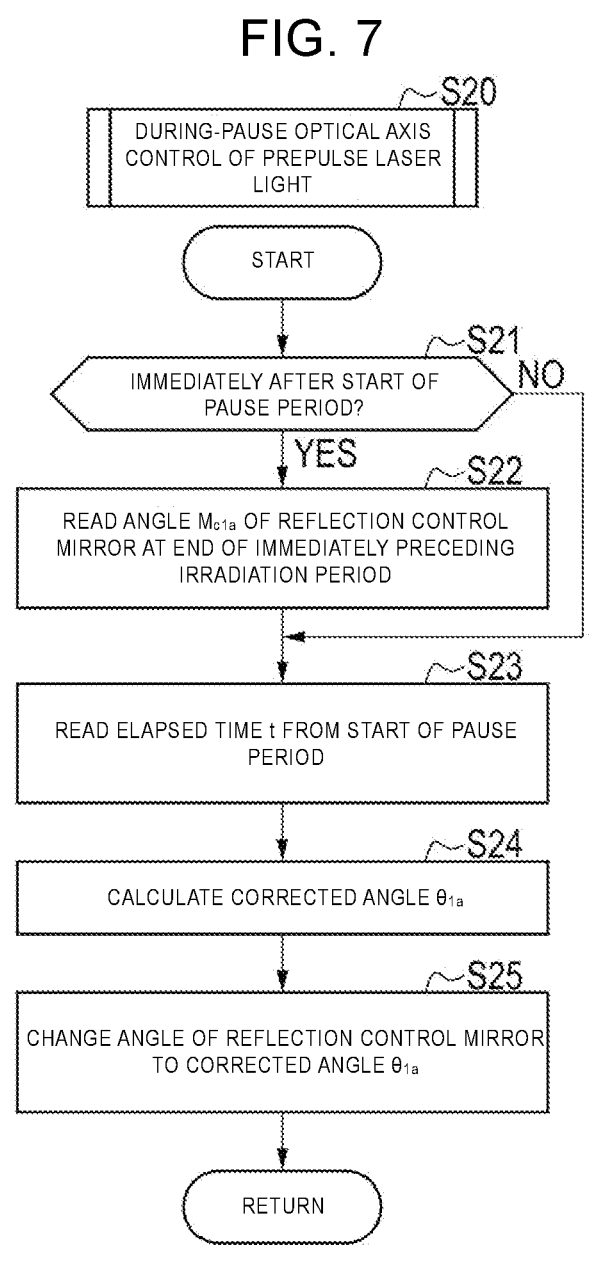

S20 DURING-PAUSE OPTICAL AXIS CONTROL OF PREPULSE LASER LIGHT

START

S21 IMMEDIATELY AFTER START OF PAUSE PERIOD?

YES

NO

S22 READ ANGLE $M_{c1a}$ OF REFLECTION CONTROL MIRROR AT END OF IMMEDIATELY PRECEDING IRRADIATION PERIOD

S23 READ ELAPSED TIME t FROM START OF PAUSE PERIOD

S24 CALCULATE CORRECTED ANGLE $\theta_{1a}$

S25 CHANGE ANGLE OF REFLECTION CONTROL MIRROR TO CORRECTED ANGLE $\theta_{1a}$

RETURN

FIG. 9
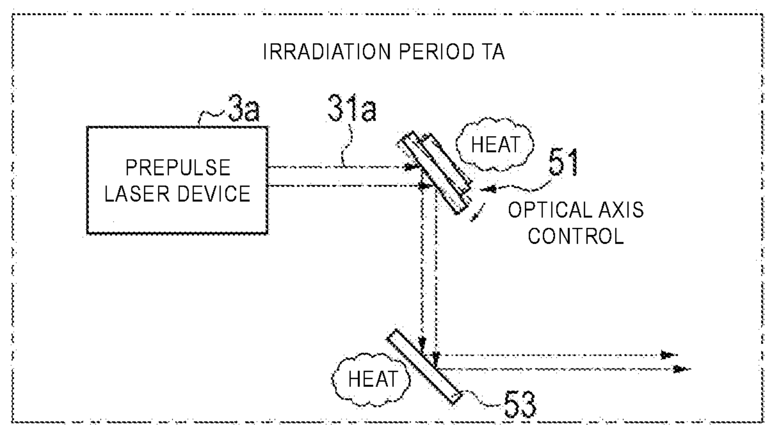
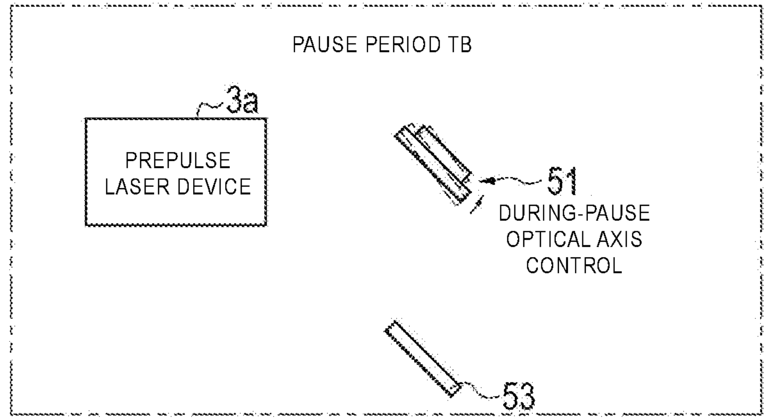
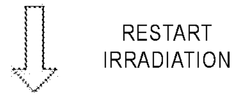
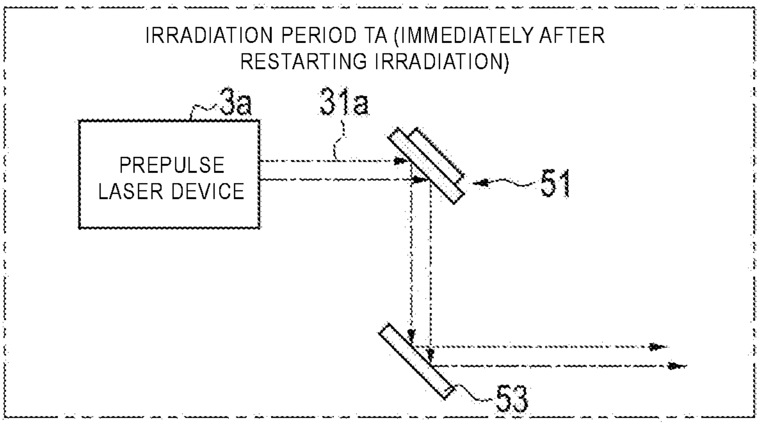

FIG. 15
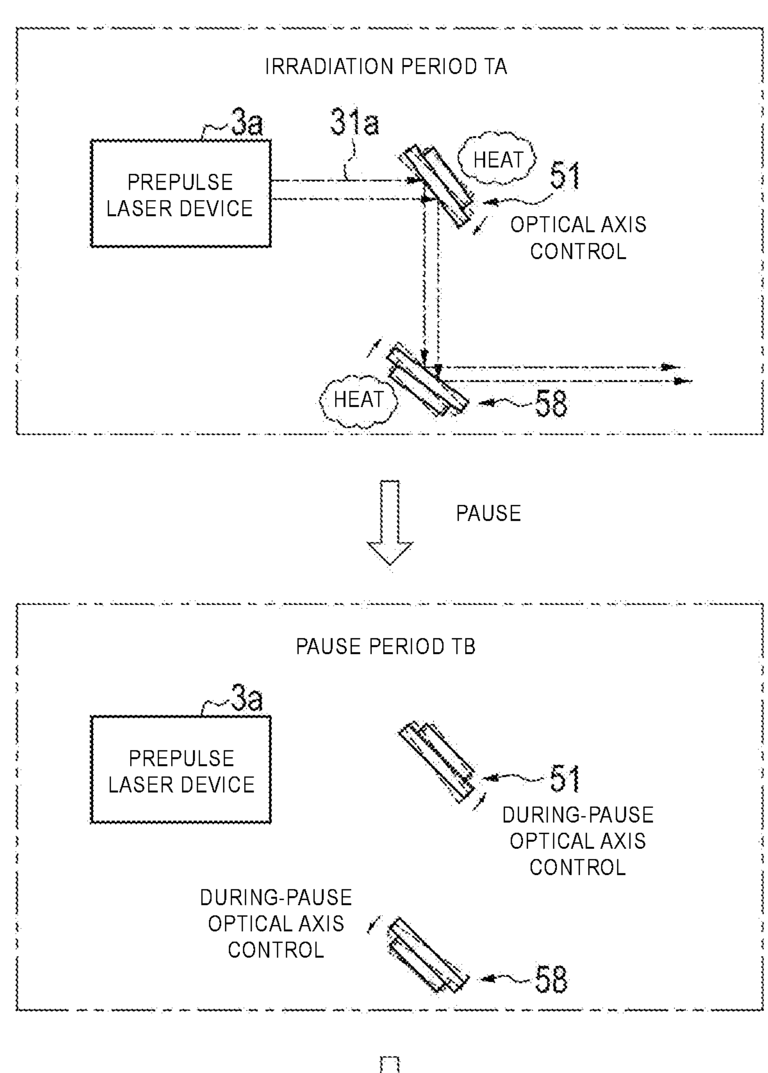
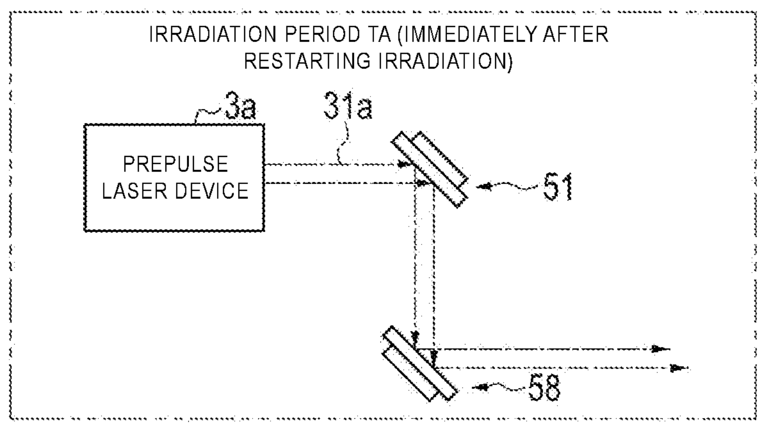

6b
118
112
110
116
114
33
11

EUV LIGHT GENERATION SYSTEM AND ELECTRONIC DEVICE MANUFACTURING METHOD

The present application claims the benefit of Japanese Patent Application No. 2022-097474, filed on Jun. 16, 2022, the entire contents of which are hereby incorporated by reference.

BACKGROUND

1. Technical Field

The present disclosure relates to an EUV light generation system and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 10 nm or less will be required. Therefore, it is expected to develop a semiconductor exposure apparatus that combines an apparatus for generating extreme ultraviolet (EUV) light having a wavelength of about 13 nm with a reduced projection reflection optical system.

As the EUV light generation apparatus, a laser produced plasma (LPP) type apparatus using plasma generated by irradiating a target with laser light has been developed.

LIST OF DOCUMENTS

Patent Documents

Patent Document 1: US Patent Application Publication No. 2018/0199422

Patent Document 2: US Patent Application Publication No. 2006/0114958

SUMMARY

An EUV light generation system, according to an aspect of the present disclosure, configured to generate EUV light by irradiating a target with pulse laser light to turn the target into plasma includes a chamber; a target supply device configured to supply the target to a plasma generation region in the chamber; a laser device configured to output the pulse laser light; a beam sensor configured to measure one of a position and an angle of an optical axis of the pulse laser light as a first optical characteristic; a first reflection control mirror whose angle is controlled so that the first optical characteristic becomes a first target value; and a processor configured to control the laser device so that the target is irradiated with the pulse laser light. Here, the processor is configured to calculate a first corrected angle based on a first attenuation curve defined by the angle of the first reflection control mirror at an end of an immediately preceding irradiation period, the angle of the first reflection control mirror at a cold state, an elapsed time from a start of the pause period, and a first time constant, and to change the angle of the first reflection control mirror to the first corrected angle, during a pause period in which output of the pulse laser light is stopped.

An electronic device manufacturing method according to an aspect of the present disclosure includes generating EUV light using an EUV light generation system, outputting the EUV light to an exposure apparatus, and exposing a photosensitive substrate to the EUV light in the exposure apparatus to manufacture an electronic device. Here, the EUV light generation system includes a chamber; a target supply device configured to supply a target to a plasma generation region in the chamber; a laser device configured to emit pulse laser light; a beam sensor configured to measure one of a position and an angle of an optical axis of the pulse laser light as a first optical characteristic; a first reflection control mirror whose angle is controlled so that the first optical characteristic becomes a first target value; and a processor configured to control the laser device so that the target is irradiated with the pulse laser light. The processor is configured to calculate a first corrected angle based on a first attenuation curve defined by the angle of the first reflection control mirror at an end of an immediately preceding irradiation period, the angle of the first reflection control mirror at a cold state, an elapsed time from a start of the pause period, and a first time constant, and to change the angle of the first reflection control mirror to the first corrected angle, during a pause period in which output of the pulse laser light is stopped.

An electronic device manufacturing method according to an aspect of the present disclosure includes inspecting a defect of a mask by irradiating the mask with EUV light generated by an EUV light generation system, selecting a mask using a result of the inspection, and exposing and transferring a pattern formed on the selected mask onto a photosensitive substrate. Here, the EUV light generation system includes a chamber; a target supply device configured to supply a target to a plasma generation region in the chamber; a laser device configured to emit pulse laser light; a beam sensor configured to measure one of a position and an angle of an optical axis of the pulse laser light as a first optical characteristic; a first reflection control mirror whose angle is controlled so that the first optical characteristic becomes a first target value; and a processor configured to control the laser device so that the target is irradiated with the pulse laser light. The processor is configured to calculate a first corrected angle based on a first attenuation curve defined by the angle of the first reflection control mirror at an end of an immediately preceding irradiation period, the angle of the first reflection control mirror at a cold state, an elapsed time from a start of the pause period, and a first time constant, and to change the angle of the first reflection control mirror to the first corrected angle, during a pause period in which output of the pulse laser light is stopped.

BRIEF DESCRIPTION OF THE DRAWINGS

Embodiments of the present disclosure will be described below merely as examples with reference to the accompanying drawings.

FIG. 3 is a diagram showing an example of the operation of an EUV light generation apparatus.

FIG. 4 is a flowchart showing the flow of optical axis control according to the comparative example.

FIG. 5 is a diagram for explaining a problem of the EUV light generation system according to the comparative example.

FIG. 7 is a flowchart showing the flow of during-pause optical axis control of the prepulse laser light.

FIG. 9 is a diagram for explaining the effect of the EUV light generation system according to the first embodiment.

FIG. 15 is a diagram for explaining the effect of the EUV light generation system according to the second embodiment.

DESCRIPTION OF EMBODIMENTS

<Contents>

Figure 1:
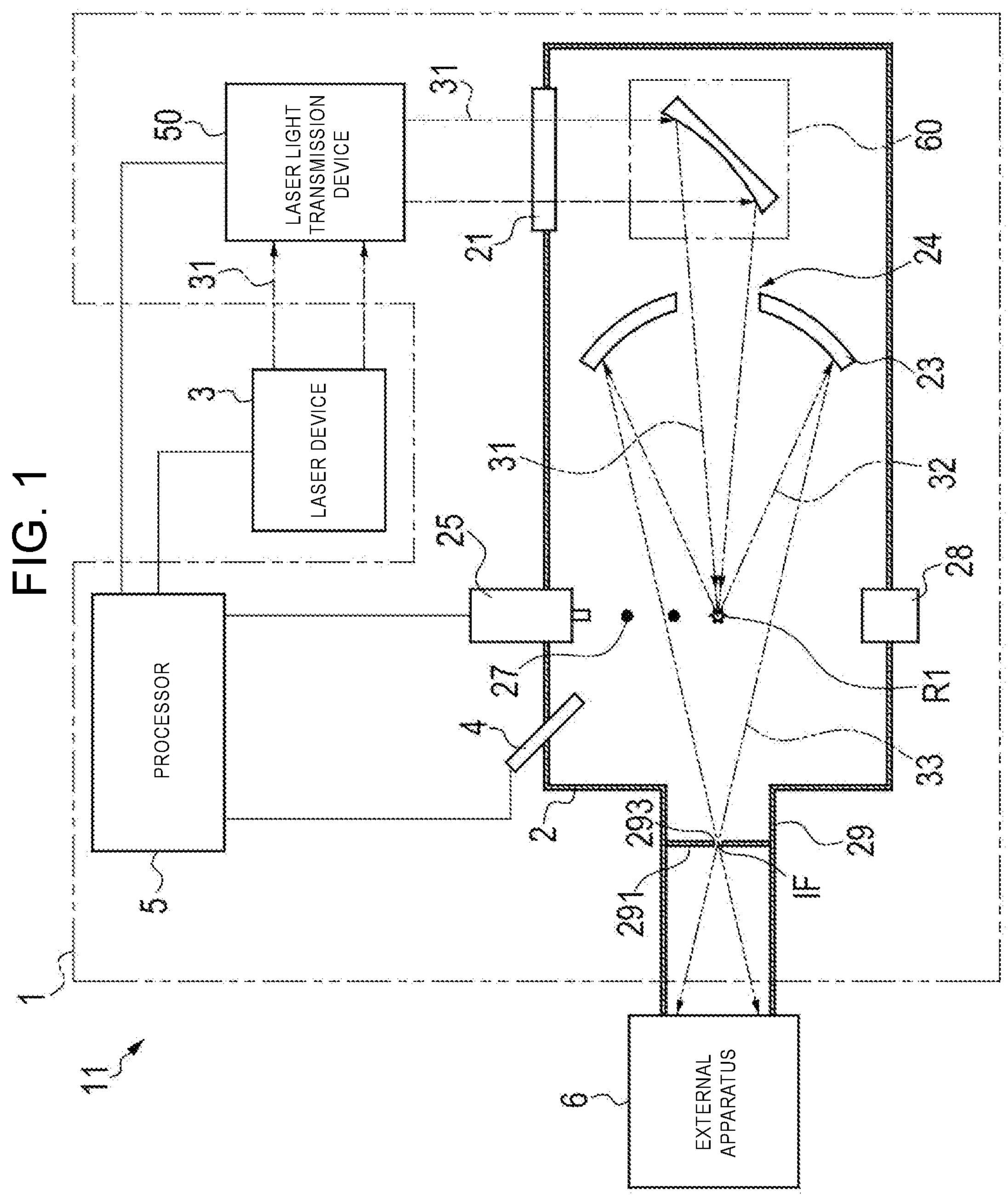
FIG. 1 is a diagram schematically showing the configuration of an LPP EUV light generation system.

1. Overall description of EUV light generation system
  1.1 Configuration
  1.2 Operation
2. EUV light generation system according to comparative example
  2.1 Configuration
  2.2 Operation
  2.3 Problem
3. EUV light generation system according to first embodiment
  3.1 Configuration
  3.2 Operation
  3.3 Effect
  3.4 Method of obtaining time constant
  3.5 Modification of first embodiment
4. EUV light generation system according to second embodiment
  4.1 Configuration
  4.2 Operation
  4.3 Effect
5. Others Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Overall Description of EUV Light Generation System

1.1 Configuration

FIG. 1 schematically shows the configuration of an LPP EUV light generation system 11. An EUV light generation apparatus 1 is used with a laser device 3. In the present disclosure, a system including the EUV light generation apparatus 1 and the laser device 3 is referred to as the EUV light generation system 11. The EUV light generation apparatus 1 includes a chamber 2 and a target supply device 25. The chamber 2 is a sealable container. The target supply device 25 supplies a target 27 in a droplet form into the chamber 2. The material of the target 27 may include tin, terbium, gadolinium, lithium, xenon, or a combination of any two or more thereof.

A through hole is formed in a wall of the chamber 2. The through hole is blocked by a window 21 through which pulse laser light 31 output from the laser device 3 passes. An EUV light concentrating mirror 23 having a spheroidal reflection surface is arranged in the chamber 2. The EUV light concentrating mirror 23 has first and second focal points. A multilayer reflection film in which molybdenum and silicon are alternately stacked is formed on a surface of the EUV light concentrating mirror 23. The EUV light concentrating mirror 23 is arranged such that the first focal point is located in a plasma generation region R1 and the second focal point is located at an intermediate focal point IF. A through hole 24 is formed at the center of the EUV light concentrating mirror 23, and the pulse laser light 31 passes through the through hole 24.

The EUV light generation apparatus 1 includes a processor 5, a target sensor 4, and the like. The target sensor 4 detects at least one of the presence, trajectory, position, and velocity of the target 27. The target sensor 4 may have an imaging function.

Further, the EUV light generation apparatus 1 includes a connection portion 29 providing communication between the inside of the chamber 2 and the inside of an external apparatus 6. A wall 291 in which an aperture 293 is formed is arranged in the connection portion 29. The wall 291 is arranged such that the aperture 293 is located at the second focal point of the EUV light concentrating mirror 23. For example, the external apparatus 6 is an exposure apparatus.

Further, the EUV light generation apparatus 1 includes a laser light transmission device 50, a laser light concentrating optical system 60, and a target collection unit 28 for collecting the target 27. The laser light transmission device 50 includes an optical element for defining a transmission state of the laser light, and an actuator for adjusting the position, posture, and the like of the optical element.

1.2 Operation

Operation of an exemplary LPP type EUV light generation system will be described with reference to FIG. 1. The pulse laser light 31 output from the laser device 3 enters, via the laser light transmission device 50, the chamber 2 through the window 21. The pulse laser light 31 having entered the chamber 2 travels along a laser light path in the chamber 2, is concentrated by the laser light concentrating optical system 60, and is radiated to the target 27.

The target supply device 25 outputs the target 27 toward the plasma generation region R1 in the chamber 2. The target 27 is irradiated with the pulse laser light 31. The target 27 irradiated with the pulse laser light 31 is turned into plasma, and radiation light 32 is radiated from the plasma. EUV light 33 contained in the radiation light 32 is selectively reflected by the EUV light concentrating mirror 23. The EUV light 33 reflected by the EUV light concentrating mirror 23 is concentrated at the intermediate focal point IF and output to the external apparatus 6. Here, one target 27 may be irradiated with a plurality of pulses included in the pulse laser light 31.

The processor 5 controls the entire EUV light generation system 11. Based on the detection result of the target sensor 4, the processor 5 controls timing at which the target 27 is output, an output direction of the target 27, and the like.

Further, the processor 5 controls oscillation timing of the laser device 3, a travel direction of the pulse laser light 31, the concentration position, and the like. The above-described various kinds of control are merely examples, and other control may be added as necessary.

Figure 2:
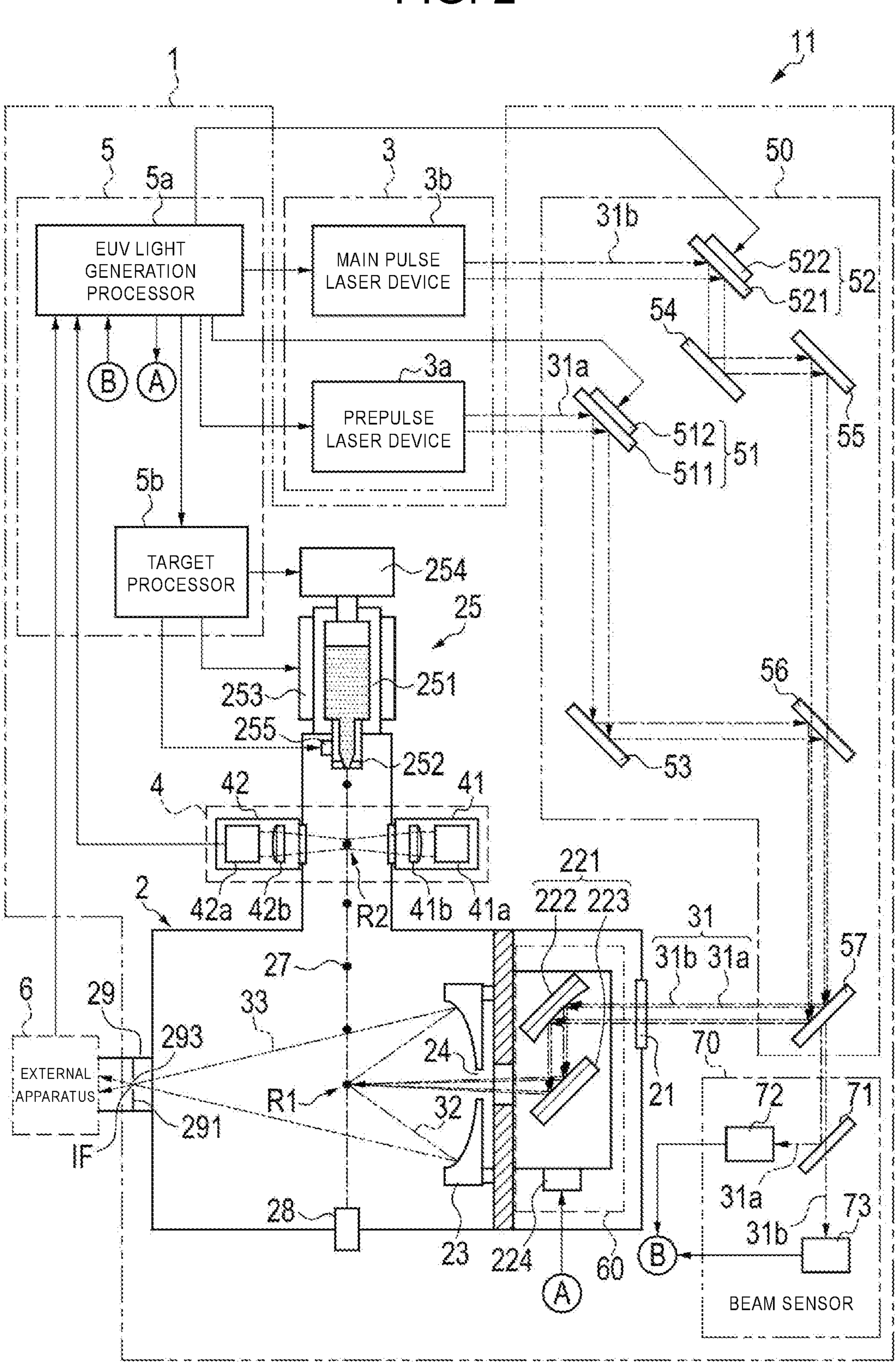
FIG. 2 is a diagram showing the configuration of the EUV light generation system according to a comparative example.

2. EUV Light Generation System According to Comparative Example 2.1 Configuration FIG. 2 schematically shows the configuration of the EUV light generation system 11 according to a comparative example. The EUV light generation apparatus 1 according to the comparative example includes a beam sensor 70 in addition to the chamber 2, the target supply device 25, the processor 5, the target sensor 4, the laser light transmission device 50, and the laser light concentrating optical system 60.

The laser device 3 outputs a plurality of beams of the pulse laser light 31 to be radiated to each of the targets 27 supplied to the plasma generation region R1. The laser device 3 outputs, as the plurality of beams of the pulse laser light 31, for example, prepulse laser light 31*a* and main pulse laser light 31*b* in this order.

The laser device 3 includes a prepulse laser device 3*a* that outputs the prepulse laser light 31*a* and a main pulse laser device 3*b* that outputs the main pulse laser light 31*b*. The prepulse laser device 3*a* is a YAG laser device or a laser device using Nd:$YVO_4$. The main pulse laser device 3*b* is, for example, a $CO_2$ laser device. Here, the main pulse laser device 3*b* may be a YAG laser device or a laser device using Nd:$YVO_4$.

The processor 5 includes an EUV light generation processor 5*a* and a target processor 5*b*. The EUV light generation processor 5*a* controls the laser device 3, the laser light transmission device 50, and the like. The target processor 5*b* controls the target supply device 25. Each of the EUV light generation processor 5*a* and the target processor 5*b* may be configured by a computer that is a combination of hardware and software.

The target supply device 25 includes a tank 251, a nozzle 252, a heater 253, a pressure regulator 254, and a piezoelectric element 255. The heater 253, the pressure regulator 254, and the piezoelectric element 255 are controlled by the target processor 5*b*.

The target sensor 4 includes an illumination unit 41 and a detection unit 42. The illumination unit 41 and the detection unit 42 are arranged to face each other across a target detection region R2 located on the trajectory of the target 27.

The illumination unit 41 includes a light source 41*a* and an illumination optical system 41*b*. The illumination unit 41 outputs illumination light toward the target 27 passing through the target detection region R2. The detection unit 42 includes an optical sensor 42*a* and a light receiving optical system 42*b*. The detection unit 42 detects the target 27 passing through the target detection region R2 by detecting the light intensity of the illumination light output from the illumination unit 41.

The output of the target sensor 4 is input to the EUV light generation processor 5*a*. The EUV light generation processor 5*a* outputs a light emission trigger to each of the prepulse laser device 3*a* and the main pulse laser device 3*b*.

The laser light transmission device 50 includes reflection control mirrors 51, 52, high reflection mirrors 53, 54, 55, a combiner element 56, and a beam splitter 57. The reflection control mirrors 51, 52 correspond to the "first reflection control mirror" according to the technology of the present disclosure.

The reflection control mirror 51 includes a high reflection mirror 511 and a stage 512. The high reflection mirror 511 is mounted on the stage 512 and is arranged at a position where the prepulse laser light 31*a* output from the prepulse laser device 3*a* is incident. The stage 512 is an actuator that changes the angle of the high reflection mirror 511. The reflection control mirror 52 includes a high reflection mirror 521 and a stage 522. The high reflection mirror 521 is mounted on the stage 522 and is arranged at a position where the main pulse laser light 31*b* output from the main pulse laser device 3*b* is incident. The stage 522 is an actuator that changes the angle of the high reflection mirror 521. The stages 512, 522 are controlled by the EUV light generation processor 5*a*.

The high reflection mirror 53 is arranged at a position such that the prepulse laser light 31*a* reflected by the reflection control mirror 51 is reflected to be incident on the combiner element 56. The high reflection mirrors 54, 55 are arranged at positions such that the main pulse laser light 31*b* reflected by the reflection control mirror 52 is reflected to be incident on the combiner element 56.

The reflection control mirror 51 and the high reflection mirror 53 are arranged such that the prepulse laser light 31*a* enters the laser light concentrating optical system 60 with a target optical characteristic. The reflection control mirror 52 and the high reflection mirror 54 are arranged such that the main pulse laser light 31*b* enters the laser light concentrating optical system 60 with a target optical characteristic. Here, the optical characteristic is one of the position and the angle of the optical axis. Note that the "optical characteristic" in the comparative example corresponds to the "first optical characteristic" according to the technology of the present disclosure.

The combiner element 56 is an element that reflects the prepulse laser light 31*a* and transmits the main pulse laser light 31*b*. The combiner element 56 is, for example, a polarizing beam combiner, and combines the optical paths of the prepulse laser light 31*a* and the main pulse laser light 31*b* having polarization directions perpendicular to each other. The optical path of the prepulse laser light 31*a* reflected by the combiner element 56 and the optical path of the main pulse laser light 31*b* transmitted through the combiner element 56 are coupled so as to substantially coincide with each other. Here, the combiner element 56 may be configured to reflect the main pulse laser light 31*b* and transmit the prepulse laser light 31*a*.

The prepulse laser light 31*a* and the main pulse laser light 31*b* whose optical paths are coupled by the combiner element 56 are incident on the beam splitter 57. The beam splitter 57 reflects a part of the prepulse laser light 31*a* and the main pulse laser light 31*b* to enter the laser light concentrating optical system 60, and transmits the other part to enter the beam sensor 70. Here, the beam splitter 57 may be configured to transmit a part of the prepulse laser light 31*a* and the main pulse laser light 31*b* to enter the laser light concentrating optical system 60, and reflect the other part to enter the beam sensor 70. Hereinafter, for convenience of explanation, the prepulse laser light 31*a* and the main pulse laser light 31*b* may be simply referred to as the pulse laser light 31 without being distinguished from each other.

The laser light concentrating optical system 60 is arranged in the chamber 2. The laser light concentrating optical system 60 is arranged on the optical path of the pulse laser light 31 transmitted through the window 21 and between the window 21 and the plasma generation region R1. The laser light concentrating optical system 60 includes a laser light concentrating mirror 221 and a manipulator 224.

The laser light concentrating mirror 221 reflects the pulse laser light 31 transmitted through the window 21 and concentrates the pulse laser light 31 on the plasma generation region R1. The laser light concentrating mirror 221 is mounted on the manipulator 224. The laser light concentrating mirror 221 includes an off-axis parabolic mirror 222 and a planar mirror 223. Here, the off-axis parabolic mirror 222 is a concave mirror. Note that the off-axis parabolic mirror 222 may be a convex mirror, and a spheroidal mirror may be used in place of the planar mirror 223.

The manipulator 224 is a stage that adjusts at least one of the position and the posture of the laser light concentrating mirror 221 so that the target 27 is irradiated with the pulse laser light 31. The manipulator 224 is controlled by the EUV light generation processor 5*a*.

The beam sensor 70 includes a beam splitter 71, a first optical axis sensor 72, and a second optical axis sensor 73. The beam splitter 71 is an element that reflects the prepulse laser light 31*a* and transmits the main pulse laser light 31*b*. The beam splitter 71 is, for example, a polarizing beam splitter, and separates the optical paths of the prepulse laser light 31*a* and the main pulse laser light 31*b* having polarization directions perpendicular to each other. The prepulse laser light 31*a* separated by the beam splitter 71 enters the first optical axis sensor 72, and the main pulse laser light 31*b* enters the second optical axis sensor 73.

The first optical axis sensor 72 is a sensor that detects the optical characteristic of the prepulse laser light 31*a*. The second optical axis sensor 73 is a sensor that detects the optical characteristic of the main pulse laser light 31*b*. The output of the first optical axis sensor 72 and the second optical axis sensor 73 are input to the EUV light generation processor 5*a*.

Each of the first optical axis sensor 72 and the second optical axis sensor 73 is a position sensor that detects the position of the optical axis or an angle sensor that detects the angle of the optical axis. In the present comparative example, each of the first optical axis sensor 72 and the second optical axis sensor 73 is a position sensor. That is, in the present comparative example, the optical characteristic is the "position of the optical axis."

Here, a beam splitter may be arranged in an optical path through which only the prepulse laser light 31*a* propagates, and the first optical axis sensor 72 may be arranged such that a part of the prepulse laser light 31*a* that has transmitted through or been reflected by the beam splitter is incident on the first optical axis sensor 72. Further, a beam splitter may be arranged in an optical path through which only the main pulse laser light 31*b* propagates, and the second optical axis sensor 73 may be arranged such that a part of the main pulse laser light 31*b* that has transmitted through or been reflected by the beam splitter is incident on the second optical axis sensor 73.

The beam sensor 70 measures the optical characteristic of the pulse laser light 31 immediately before entering the chamber 2 so that the pulse laser light 31 enters the chamber 2 with the target optical characteristic. In the present comparative example, the beam sensor 70 measures the optical characteristic of the pulse laser light 31 immediately before entering the laser light concentrating optical system 60.

2.2 Operation

The operation of the EUV light generation system 11 according to the comparative example will be described. First, the EUV light generation processor 5*a* outputs, to the prepulse laser device 3*a*, setting values such as the pulse energy, the pulse width, and the pulse waveform of the prepulse laser light 31*a*. Further, the EUV light generation processor 5*a* outputs, to the main pulse laser device 3*b*, setting values such as the pulse energy, the pulse width, and the pulse waveform of the main pulse laser light 31*b*.

The target processor 5*b* controls the heater 253 of the target supply device 25 to heat the material of the target 27 in the tank 251 to a temperature higher than the melting point thereof to melt it. In the present comparative example, the material of the target 27 is tin, and the tank 251 is filled with molten liquid tin.

When receiving a signal requesting generation of the EUV light from the external apparatus 6, the EUV light generation apparatus 1 transmits a droplet generation signal to the target processor 5*b*. When receiving the droplet generation signal, the target processor 5*b* controls the pressure in the tank 251 to a predetermined pressure via the pressure regulator 254. As a result, a jet of the liquid tin is output from the nozzle 252 at a constant velocity.

The target processor 5*b* applies a voltage having a predetermined waveform to the piezoelectric element 255 fixed to the nozzle 252 such that the targets 27 in a droplet form are generated from the jet of the liquid tin at a predetermined frequency. As a result, the targets 27 are generated at a constant frequency.

The target sensor 4 detects the timing at which the target 27 passes through the target detection region R2, and outputs a passage timing signal representing the detected timing to the EUV light generation processor 5*a*.

The EUV light generation processor 5*a* outputs a signal obtained by delaying the passage timing signal by a first delay time to the prepulse laser device 3*a* as the first light emission trigger signal. The prepulse laser device 3*a* outputs the prepulse laser light 31*a* having the target pulse energy, pulse width, and pulse waveform in accordance with the first light emission trigger signal.

The prepulse laser light 31*a* is reflected by the reflection control mirror 51, the high reflection mirror 53, the combiner element 56, and the beam splitter 57 in the laser light transmission device 50, and enters the laser light concentrating optical system 60. The prepulse laser light 31*a* is concentrated by the laser light concentrating optical system 60 and is radiated to the target 27. The target 27 in the droplet form to be irradiated with the prepulse laser light 31*a* is also referred to as a primary target.

The primary target is broken by the irradiation of the prepulse laser light 31*a*, and becomes a secondary target spreading in a mist form. Here, the term "mist form" refers to a state in which micro-droplets, clusters, and the like are diffused by the primary target being broken by the prepulse laser light 31*a*.

The EUV light generation processor 5*a* outputs a signal obtained by delaying the passage timing signal by a second delay time to the main pulse laser device 3*b* as the second light emission trigger signal. The main pulse laser device 3*b* outputs the main pulse laser light 31*b* having the target pulse energy, pulse width, and pulse waveform in accordance with the second light emission trigger signal.

The main pulse laser light 31*b* is reflected by the reflection control mirror 52 and the high reflection mirrors 54, 55 in the laser light transmission device 50, is transmitted through the combiner element 56, and reflected by the beam splitter 57, thereby enters the laser light concentrating optical system 60. The main pulse laser light 31*b* is concentrated by the laser light concentrating optical system 60 and is radiated to the target 27 as the secondary target. As a result, the secondary target is turned into plasma, and the radiation light 32 including the EUV light 33 is generated.

The prepulse laser light 31*a* transmitted through the beam splitter 57 enters the beam sensor 70, is reflected by the beam splitter 71, and enters the first optical axis sensor 72. The first optical axis sensor 72 measures the optical characteristic of the prepulse laser light 31*a* and outputs the measurement value to the EUV light generation processor 5*a*.

The main pulse laser light 31*b* transmitted through the beam splitter 57 enters the beam sensor 70, is transmitted through the beam splitter 71, and enters the second optical axis sensor 73. The second optical axis sensor 73 measures the optical characteristic of the main pulse laser light 31*b* and outputs the measurement value to the EUV light generation processor 5*a*.

The EUV light generation processor 5*a* controls the angle of the reflection control mirror 51 so that the optical characteristic of the prepulse laser light 31*a* measured by the first optical axis sensor 72 becomes a target value. Further, the EUV light generation processor 5*a* controls the angle of the reflection control mirror 52 so that the optical characteristic of the main pulse laser light 31*b* measured by the second optical axis sensor 73 becomes a target value. Hereinafter, control of the reflection control mirrors 51, 52 by the EUV light generation processor 5*a* is referred to as optical axis control. Here, the "target value" in the present comparative example corresponds to the "first target value" according to the technology of the present disclosure.

Figures 3, 4:
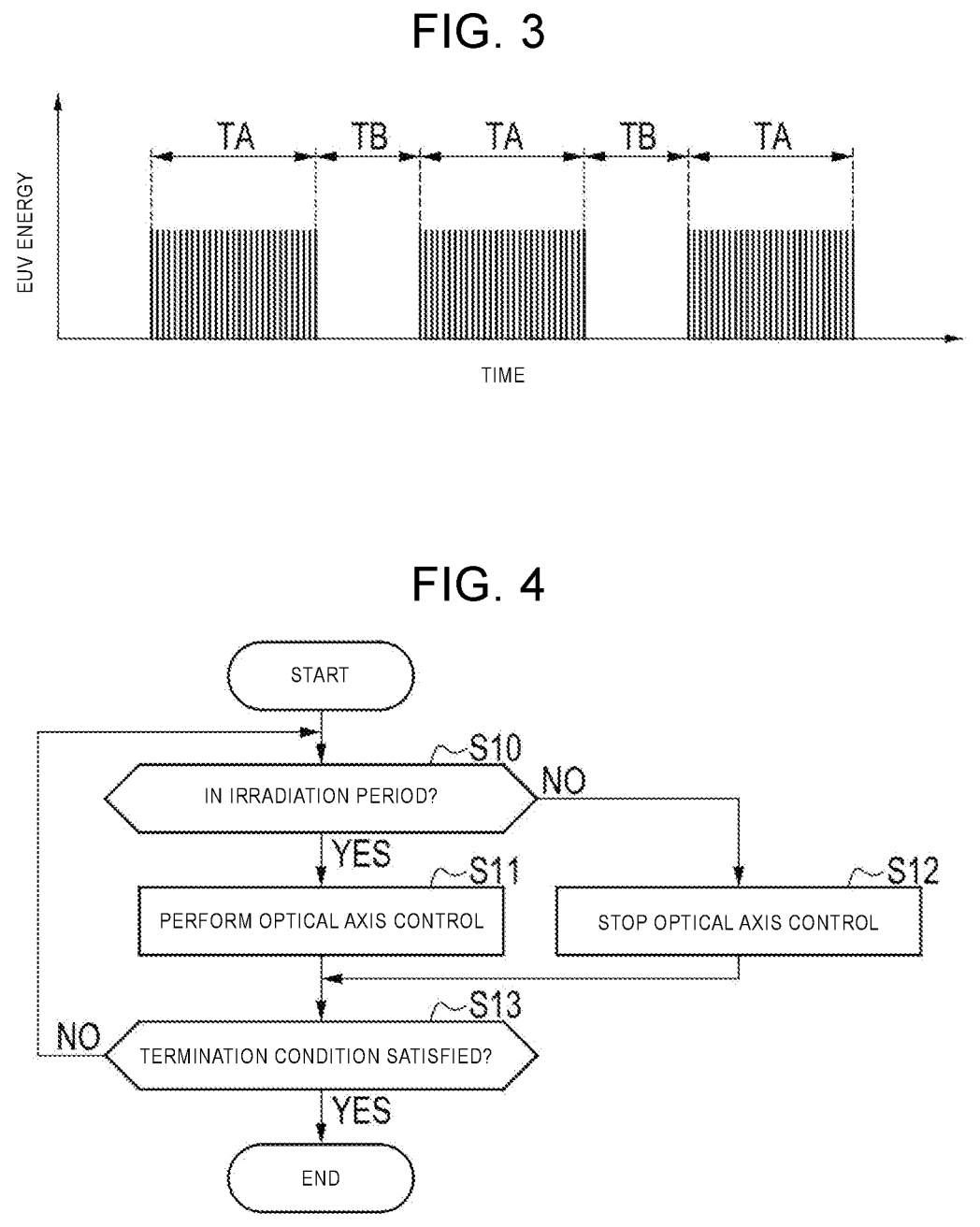

FIG. 3 shows an example of the operation of the EUV light generation apparatus 1. In FIG. 3, the vertical axis represents the energy of the EUV light 33, and the horizontal axis represents time.

The operation of the EUV light generation apparatus 1 includes an irradiation period TA in which the EUV light 33 is output and a pause period TB in which the EUV light 33 is not output. In the irradiation period TA, the EUV light generation apparatus 1 performs so-called burst light emission operation in which a plurality of pulses of the EUV light 33 are output at a high repetition frequency. In the pause period TB, the EUV light generation apparatus 1 pauses the output of the pulse laser light 31 from the laser device 3.

For example, when the external apparatus 6 is an exposure apparatus, the EUV light generation apparatus 1 alternately repeats the irradiation period TA and the pause period TB as shown in FIG. 3 based on a repetitive pattern signal supplied from the external apparatus 6. When the external apparatus 6 is an inspection apparatus, the EUV light generation apparatus 1 performs operation of irradiating or pausing of the EUV light 33 in accordance with a command from the external apparatus 6.

FIG. 4 shows the flow of the optical axis control according to the comparative example. First, in step S10, the EUV light generation processor 5*a* determines whether or not the current time point is in the irradiation period TA. When the EUV light generation processor 5*a* determines that it is in the irradiation period TA, processing proceeds to step S11. When the EUV light generation processor 5*a* determines that it is not in the irradiation period TA, processing proceeds to step S12.

In step S11, the EUV light generation processor 5*a* performs the above-described optical axis control based on the measurement value of the beam sensor 70. In step S12, the EUV light generation processor 5*a* stops the optical axis control. When step S11 or step S12 ends, processing proceeds to step S13.

In step S13, the EUV light generation processor 5*a* determines whether or not a termination condition is satisfied. For example, the termination condition is that the EUV light generation apparatus 1 receives an operation termination command from the external apparatus 6. When it is determined that the termination condition is not satisfied, the EUV light generation processor 5*a* returns processing to step S10. When it is determined that the termination condition is satisfied, the EUV light generation processor 5*a* ends processing.

Through the above process, the optical axis control is performed in the irradiation period TA, and the optical axis control is stopped in the pause period TB.

2.3 Problem

FIG. 5 explains the problem of the EUV light generation system 11 according to the comparative example. For convenience of explanation, FIG. 5 shows only the optical axis control of the prepulse laser light 31*a*. The same applies to the optical axis control of the main pulse laser light 31*b*.

In the irradiation period TA, the temperature of the optical elements in the laser light transmission device 50 is increased due to the prepulse laser light 31*a* and the main pulse laser light 31*b*, and thermal load deformation of the optical elements occurs. For example, as the thermal load deformation, wavefront distortion occurs in the optical elements. In the irradiation period TA, the EUV light generation processor 5*a* performs the optical axis control for controlling the angles of the reflection control mirrors 51, 52 so as to correct the deviation of the optical characteristic caused by the thermal load deformation from the target value.

When the irradiation period TA ends and shifts to the pause period TB, the temperature of the optical elements in the laser light transmission device 50 decreases, and the thermal load deformation reverts as the temperature decreases. For example, as the temperature decreases, the wavefront distortion of the optical elements decreases. However, since the optical axis control is not performed in the pause period TB, the angles of the reflection control mirrors 51, 52 are maintained at angles set in consideration of the thermal load deformation at the end of the irradiation period TA.

Then, when the pause period TB ends and shifts to the irradiation period TA, immediately after the restart of the irradiation, the angles of the reflection control mirrors 51, 52 remains maintained at the angles set in consideration of the thermal load deformation at the end of the immediately preceding irradiation period TA even though the thermal load deformation has reverted. As a result, the prepulse laser light 31*a* and the main pulse laser light 31*b* enter the laser light concentrating optical system 60 each with the optical characteristic deviated from the target value. As a result, the primary target is not appropriately irradiated with the prepulse laser light 31*a*, and the secondary target is not appropriately irradiated with the main pulse laser light 31*b*.

Therefore, in the EUV light generation system 11 according to the comparative example, there is a problem that the EUV light 33 is not stably generated immediately after shifting from the pause period TB to the irradiation period TA.

3. EUV Light Generation System According to First Embodiment

The EUV light generation system 11 according to a first embodiment will be described. Any component same as that described above is denoted by an identical reference sign, and duplicate description thereof is omitted unless specific description is needed.

3.1 Configuration

The configuration of the EUV light generation system 11 according to the first embodiment may be similar to the configuration of the EUV light generation system 11 according to the comparative example. In the first embodiment, the EUV light generation processor 5*a* performs the optical axis control even in the pause period TB. Hereinafter, the optical axis control in the pause period TB is also referred to as during-pause optical axis control.

3.2 Operation

The operation of the EUV light generation system 11 according to the first embodiment will be described. The operation of the EUV light generation system 11 according to the first embodiment is similar to the operation of the EUV light generation system 11 according to the comparative embodiment except for the optical axis control by the EUV light generation processor 5*a*.

Figure 6:
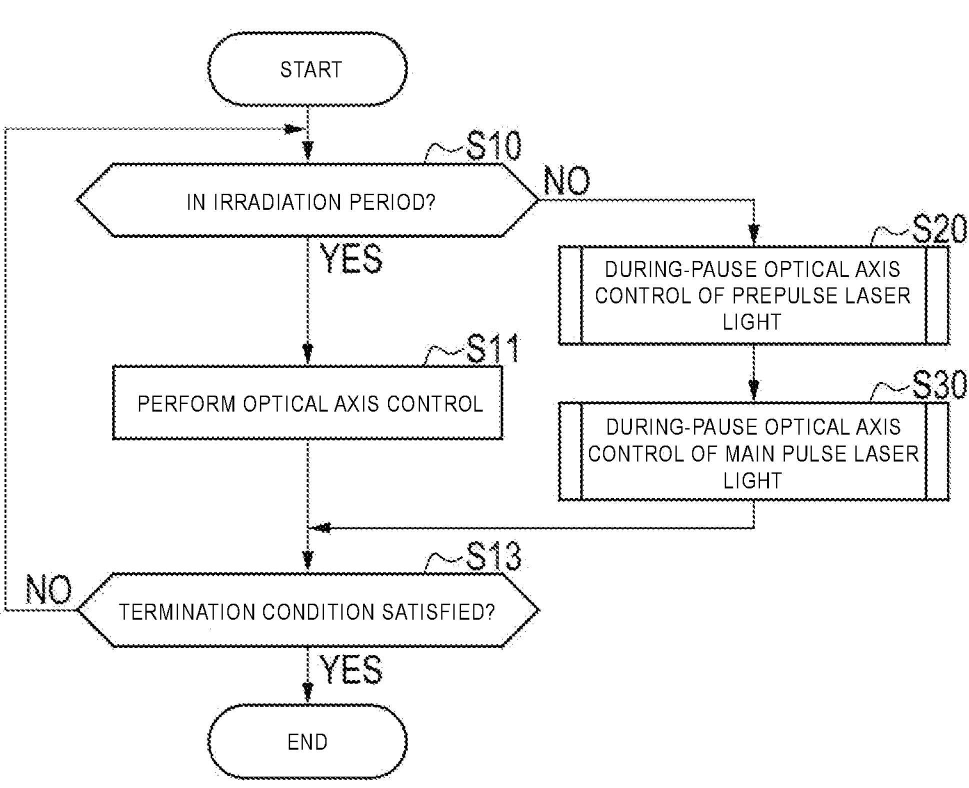
FIG. 6 is a flowchart showing the flow of the optical axis control according to the first embodiment.

FIG. 6 shows the flow of the optical axis control according to the first embodiment. In the first embodiment, when it is determined in step S10 that the current time point is not in the irradiation period TA, the EUV light generation processor 5*a* performs step S20 and step S30 in place of step S12 shown in FIG. 4. In step S20, the EUV light generation processor 5*a* performs the during-pause optical axis control of the prepulse laser light 31*a*. In step S30, the EUV light generation processor 5*a* performs the during-pause optical axis control of the main pulse laser light 31*b*. As will be described in detail later, the during-pause optical axis control is control for changing the angles of the reflection control mirrors 51, 52 so as to cancel out the change in the optical axis due to the revert of the thermal load deformation during the pause period TB. The EUV light generation processor 5*a* changes the angles of the reflection control mirrors 51, 52 at regular intervals.

FIG. 7 shows the flow of the during-pause optical axis control of the prepulse laser light 31*a*. In step S21, the EUV light generation processor 5*a* determines whether or not the current time point is immediately after the start of the pause period TB. When the EUV light generation processor 5*a* determines that it is immediately after the start of the pause period TB, processing proceeds to step S22. When the EUV light generation processor 5*a* determines that it is not immediately after the start of the pause period TB, processing proceeds to step S23. Here, the term "immediately after the start of the pause period TB" refers to when the process of step S21 is first processed after the start of the pause period TB.

In step S22, the EUV light generation processor 5*a* reads an angle $M_{c1a}$ of the reflection control mirror 51 at the end of the immediately preceding irradiation period TA. Here, the angle $M_{c1a}$ is a command value of the angle given to the reflection control mirror 51 by the EUV light generation processor 5*a* at the end of the immediately preceding irradiation period TA.

In step S23, the EUV light generation processor 5*a* reads an elapsed time t from the start of the pause period TB from a timer (not shown).

In step S24, the EUV light generation processor 5*a* calculates a corrected angle $\theta_{1a}$ by applying the angle $M_{c1a}$ read in step S22 and the elapsed time t read in step S23 to the following expression (1).

[Expression 1]

$$\theta_{1a} = M_{c1a} + (M_{i1a} - M_{c1a}) \times \left(1 - e^{-t/\tau_{1a}}\right) \tag{1}$$

Here, $M_{i1a}$ is the angle of the reflection control mirror 51 in a cold state. Here, similarly to the angle $M_{c1a}$, the angle $M_{i1a}$ is a command value of the angle given to the reflection control mirror 51 by the EUV light generation processor 5*a*. The cold state is a time point at which the heat load deformation has sufficiently reverted. Here, $\tau_{1a}$ is a time constant obtained by a method described later. The above expression (1) is an attenuation curve corresponding to the change in the optical axis of the prepulse laser light 31*a* in the pause period TB. The corrected angle $\theta_{1a}$ corresponds to the "first corrected angle" according to the technology of the present disclosure. The time constant $\tau_{1a}$ corresponds to the "first time constant" according to the technology of the present disclosure.

In step S25, the EUV light generation processor 5*a* changes the angle of the reflection control mirror 51 to the corrected angle $\theta_{1a}$. Here, the EUV light generation processor 5*a* changes the angle of the reflection control mirror 51 by applying the corrected angle $\theta_{1a}$ to the reflection control mirror 51 as a command value.

Figure 8:
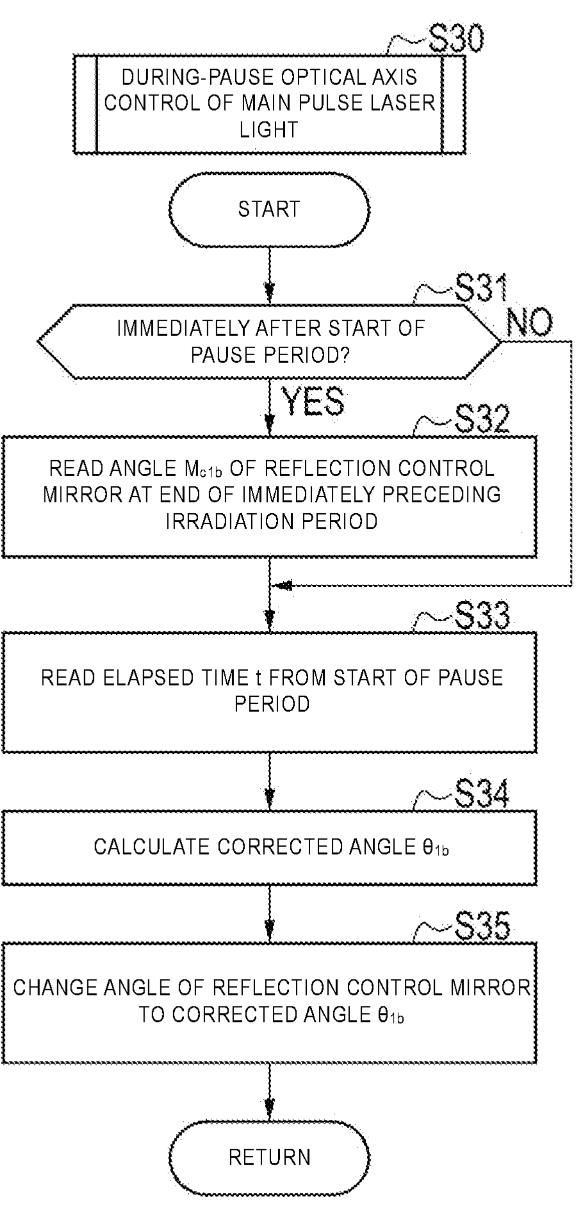
FIG. 8 is a flowchart showing the flow of the during-pause optical axis control of the main pulse laser light.

FIG. 8 shows the flow of the during-pause optical axis control of the main pulse laser light 31*b*. In steps S31 to S35 shown in FIG. 8, processes similar to steps S21 to S25 shown in FIG. 7 are performed.

In step S32, the EUV light generation processor 5*a* reads an angle Mat, of the reflection control mirror 52 at the end of the immediately preceding irradiation period TA. In step S34, the EUV light generation processor 5*a* calculates a corrected angle $\theta_{1b}$ by applying the angle Mat, read in step S32 and the elapsed time t read in step S33 to the following expression (2).

[Expression 2]

$$\theta_{1b} = M_{c1b} + (M_{i1b} - M_{c1b}) \times \left(1 - e^{-t/\tau_{1b}}\right) \tag{2}$$

Here, $M_{i1b}$ is the angle of the reflection control mirror 52 in the cold state. Here, $\tau_{1b}$ is a time constant obtained by a method described later. The above expression (2) is an attenuation curve corresponding to the change in the optical axis of the main pulse laser light 31*b* in the pause period TB. Here, the corrected angle $\theta_{1b}$ corresponds to the "first corrected angle" according to the technology of the present disclosure. The time constant $\tau_{1b}$ corresponds to the "first time constant" according to the technology of the present disclosure.

In step S35, the EUV light generation processor 5*a* changes the angle of the reflection control mirror 52 to the corrected angle $\theta_{1b}$. In other respects, it is similar to the optical axis control of the prepulse laser light 31*a* described above.

3.3 Effect

FIG. 9 explains the effect of the EUV light generation system 11 according to the first embodiment. For convenience of explanation, FIG. 9 shows only the optical axis control and the during-pause optical axis control of the prepulse laser light 31*a*. The same applies to the optical axis control and the during-pause optical axis control of the main pulse laser light 31*b*.

Similarly to the comparative example, in the irradiation period TA, the EUV light generation processor 5*a* performs the optical axis control for controlling the angles of the reflection control mirrors 51, 52 so as to correct the deviation of the optical characteristic caused by the thermal load deformation from the target value.

When the irradiation period TA ends and shifts to the pause period TB, the EUV light generation processor 5*a* performs the during-pause optical axis control for changing the angles of the reflection control mirrors 51, 52 so as to cancel out the change in the optical axis caused by the revert of the thermal load deformation.

Then, when the pause period TB ends and shifts to the irradiation period TA, the irradiation is restarted. In the present embodiment, since the during-pause optical axis control is performed during the pause period TB, the prepulse laser light 31*a* and the main pulse laser light 31*b* enter the laser light concentrating optical system 60 in a state in which the optical characteristic is maintained at the target value even immediately after the irradiation is restarted. As a result, the primary target is appropriately irradiated with the prepulse laser light 31*a*, and the secondary target is appropriately irradiated with the main pulse laser light 31*b*.

Therefore, in the EUV light generation system 11 according to the first embodiment, it is possible to generate the EUV light 33 stably even immediately after shifting from the pause period TB to the irradiation period TA.

3.4 Method of Obtaining Time Constant

Next, a method of obtaining the time constant $\tau_{1a}$ will be described. The EUV light generation system 11 is operated and the angle $M_{c1a}$ of the reflection control mirror 51 when the thermal load deformation is saturated is obtained. For example, in the irradiation period TA, the prepulse laser light 31*a* and the main pulse laser light 31*b* are output while performing the optical axis control with the repetition frequency set to 20 kHz and the duty set to 100%. After 15 minutes elapses from the start of the irradiation, the output of the prepulse laser light 31*a* and the main pulse laser light 31*b* is stopped, and the optical axis control is stopped. Then, the command value of the angle of the reflection control mirror 51 at the end of the irradiation period TA is set as the angle $M_{c1a}$.

In order to measure the change in the optical axis during the pause, the position of the optical axis is measured by the first optical axis sensor 72 while outputting the prepulse laser light 31*a* at a low duty. The output is set to a low duty in order to prevent thermal load deformation from occurring in the reflection control mirror 51. For example, the repetition frequency is set to 20 kHz and the duty is set to 2%. For example, the duty is set to 2% by setting the ON period of the burst pulse to 250 ms and the OFF period to 12250 ms.

The measurement by the first optical axis sensor 72 is continued until the cold state at which the position of the optical axis does not change. Here, there is a linear relationship expressed by the following expression (3) between a position change amount $\Delta PL_{pos}$ of the optical axis and an angle change amount $\Delta M_{pos}$ of the reflection control mirror 51. Here, A is a coefficient.

[Expression 3]

$$\Delta PL_{pos} = A \times \Delta M_{pos} \tag{3}$$

The position change of the optical axis measured by the first optical axis sensor 72 is converted into the angle of the reflection control mirror 51 using the above expression (3). By this conversion, the angle of the reflection control mirror 51 at the cold state is calculated, and the calculated value is set as the angle $M_{i1a}$.

Figure 10:
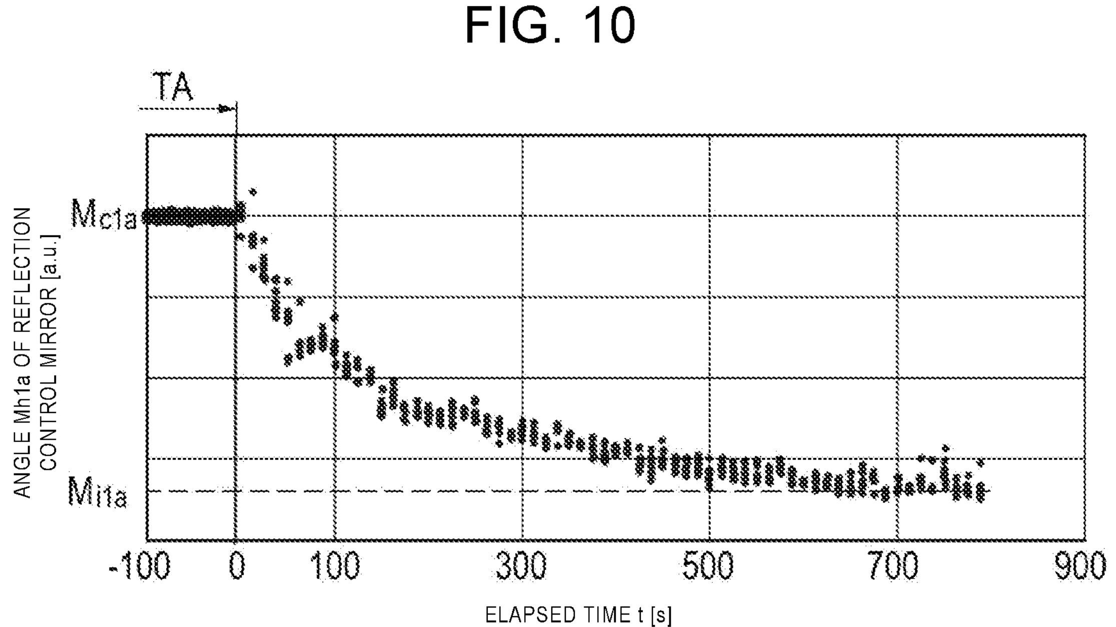
FIG. 10 is a graph showing an example of the angle change of a reflection control mirror with respect to an elapsed time.

Next, a graph is created in which the horizontal axis represents the elapsed time t from the start of the output of the low duty and the vertical axis represents the angle $M_{h1a}$ of the reflection control mirror 51. The angle $M_{h1a}$ value obtained by converting the position of the optical axis measured by the first optical axis sensor 72 into the angle of the reflection control mirror 51 using the above expression (3). FIG. 10 shows an example of the created graph. Then, the change in the angle $M_{h1a}$ with respect to the elapsed time t is approximated by an attenuation curve of the following expression (4).

[Expression 4]

$$M_{h1a} = (M_{c1a} - M_{i1a}) \times e^{-t/\tau_a} \tag{4}$$

Here, $\tau_{1a}$ obtained by this approximation is the time constant $\tau_{1a}$. The above expression (1) is defined using the time constant Tia, the angle $M_{c1a}$, and the angle $M_{i1a}$.

Here, there is a linear relationship expressed by the following expression (5) between an angle change amount $\Delta PL_{poi}$ of the optical axis and an angle change amount $\Delta M_{poi}$ of the reflection control mirror 51. Here, B is a coefficient.

[Expression 5]

$$\Delta PL_{poi} = B \times \Delta M_{poi} \tag{5}$$

When the first optical axis sensor 72 measures the angle of the optical axis, the angle change of the optical axis measured by the first optical axis sensor 72 may be converted into the angle of the reflection control mirror 51 using the above expression (5).

Further, since the time constant rib can be obtained by the similar method as the time constant $\tau_{1a}$, description thereof will be omitted.

3.5 Modification of First Embodiment

Next, modification of the first embodiment will be described. In the first embodiment, the EUV light generation processor 5*a* calculates the corrected angle $\theta_{1a}$ using the above expression (1), but in the present modification, the corrected angle $\theta_{1a}$ is calculated using the following expression (6).

[Expression 6]

$$\theta_{1a} = M_{c1a} + (M_{i1a} - M_{c1a}) \times \left(1 - \sum_{i=1}^{n} C_i e^{-t/\tau_{1ai}}\right) \tag{6}$$

Here, $\tau_{1ai}$ is a time constant. Here, i is a positive integer between 1 and n. $C_i$ is a contribution coefficient of the time constant $\tau_{1ai}$ and satisfies the relation of the following expression (7).

[Expression 7]

$$\sum_{i=1}^{n} C_i = 1 \tag{7}$$

In the present modification, the time constant τ1*a* includes a plurality of the time constants $\tau_{1ai}$. The above expression (6) is a function obtained by adding a plurality of attenuation curves represented by a plurality of the time constants When each of time constants $\tau_{1ai}$ is to be obtained, the relationship between the elapsed time t and the angle $M_{h1a}$ may be approximated using an attenuation curve of the following expression (8) instead of the above expression (4).

[Expression 8]

$$M_{h1a} = (M_{c1a} - M_{i1a}) \times \sum_{i=1}^{n} C_i e^{-t/\tau_{1ai}} \quad (8)$$

Although the calculation of the corrected angle $\theta_{1a}$ has been described above, the calculation of the corrected angle $\theta_{1b}$ can be modified in the similar manner.

According to the present modification, since the approximation error of the attenuation curve can be reduced, the corrected angles $\theta_{1a}$, $\theta_{1b}$ can be calculated with higher accuracy. As a result, the primary target and the secondary target can be appropriately irradiated with the prepulse laser light 31*a* and the main pulse laser light 31*b*, and the EUV light 33 can be generated more stably immediately after the restart of the irradiation.

4. EUV Light Generation System According to Second Embodiment

Next, the EUV light generation system 11A according to the second embodiment will be described. Any component same as that described above is denoted by an identical reference sign, and duplicate description thereof is omitted unless specific description is needed.

4.1 Configuration

Figure 11:
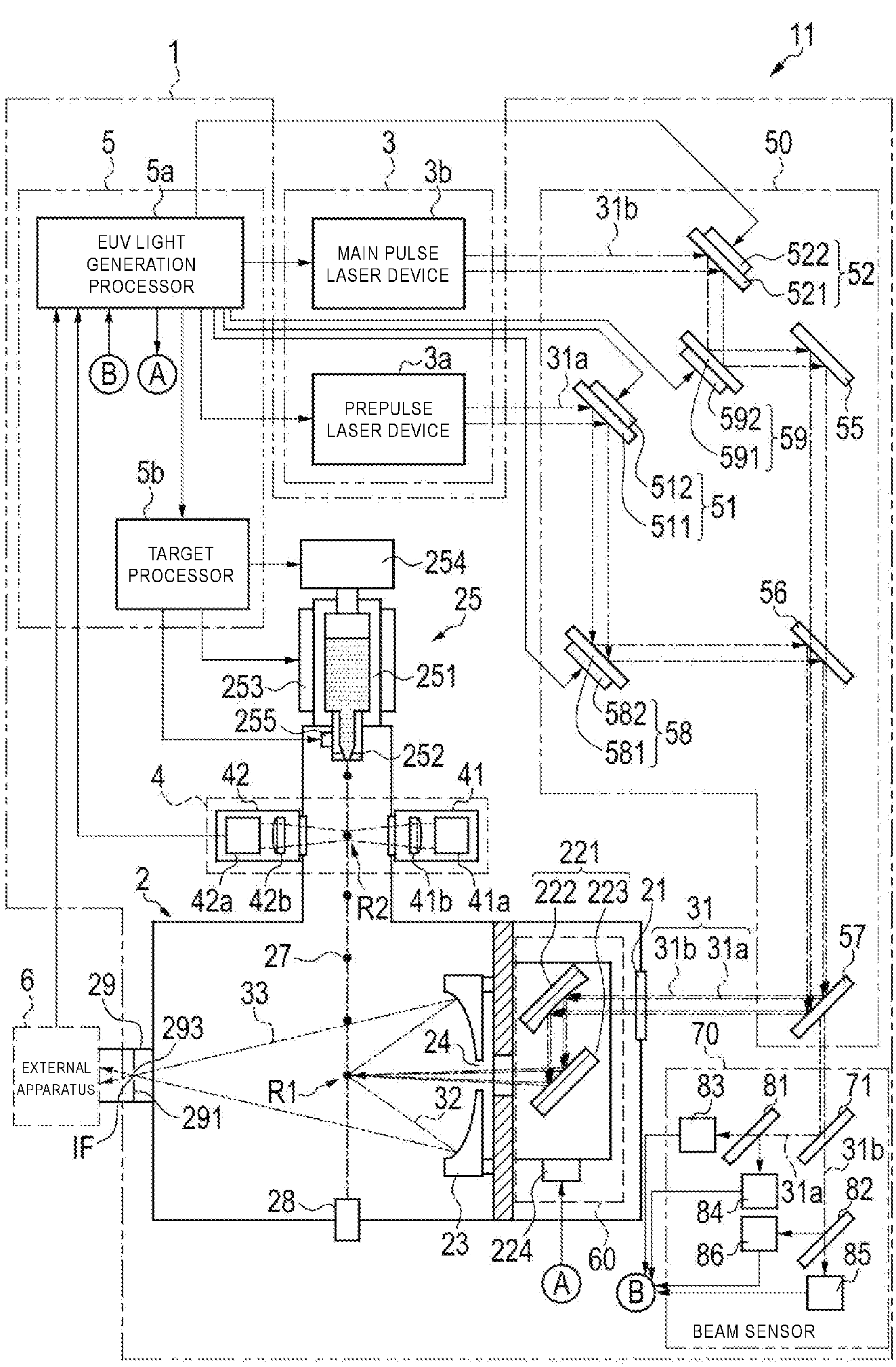
FIG. 11 is a diagram showing the configuration of the EUV light generation system according to a second embodiment.

FIG. 11 schematically shows the configuration of the EUV light generation system 11 according to a second embodiment. The EUV light generation system 11 according to the second embodiment differs from the EUV light generation system 11 according to the first embodiment in the configuration of the laser light transmission device 50 and the beam sensor 70.

In the laser light transmission device 50 according to the second embodiment, a reflection control mirror 58 is provided in place of the high reflection mirror 53, and a reflection control mirror 59 is provided in place of the high reflection mirror 54. The reflection control mirror 58 is provided downstream of the reflection control mirror 51 in the propagation direction of the prepulse laser light 31*a*. The reflection control mirror 59 is provided downstream of the reflection control mirror 52 in the propagation direction of the main pulse laser light 31*b*. Other configurations are similar to those of the laser light transmission device 50 according to the first embodiment.

In the present embodiment, the reflection control mirror 51 is referred to as a "first reflection control mirror 51", and the reflection control mirror 58 is referred to as a "second reflection control mirror 58." Further, the reflection control mirror 52 is referred to as a "first reflection control mirror 52", and the reflection control mirror 59 is referred to as a "second reflection control mirror 59."

The second reflection control mirror 58 includes a high reflection mirror 581 and a stage 582. The high reflection mirror 581 is mounted on the stage 582 and is arranged at a position where the prepulse laser light 31*a* reflected by the first reflection control mirror 51 is incident. The second reflection control mirror 59 includes a high reflection mirror 591 and a stage 592. The high reflection mirror 591 is mounted on the stage 592 and is arranged at a position where the main pulse laser light 31*b* reflected by the first reflection control mirror 52 is incident.

The beam sensor 70 according to the second embodiment is provided with beam splitters 81, 82 in addition to the beam splitter 71. Further, the beam sensor 70 is provided with a first position sensor 83 and a first angle sensor 84 in place of the first optical axis sensor 72, and is provided with a second position sensor 85 and a second angle sensor 86 in place of the second optical axis sensor 73. Each of the first position sensor 83 and the second optical axis sensor 73 includes, for example, two lenses and one charge coupled device (CCD) camera. Each of the first angle sensor 84 and the second angle sensor 86 includes, for example, one lens and one CCD camera.

In the present embodiment, the beam sensor 70 measures the first optical characteristic and the second optical characteristic. The first optical characteristic is the "position of the optical axis" and the second optical characteristic is the "angle of the optical axis." In the present embodiment, the angles of the first reflection control mirrors 51, 52 are controlled so that the first optical characteristic becomes the first target value. The angles of the second reflection control mirrors 58, 59 are controlled so that the second optical characteristic becomes a second target value.

The beam sensor 70 measures the first optical characteristic and the second optical characteristic of the pulse laser light 31 immediately before entering the chamber 2 so that the pulse laser light 31 enters the chamber 2 with the target first optical characteristic and the target second optical characteristic. In the present embodiment, the beam sensor 70 measures the first optical characteristic and the second optical characteristic of the pulse laser light 31 immediately before entering the laser light concentrating optical system 60.

4.2 Operation

The operation of the EUV light generation system 11 according to the second embodiment will be described. In the present embodiment, the prepulse laser light 31*a* that has entered the laser light transmission device 50 is reflected by the first reflection control mirror 51, the second reflection control mirror 58, the combiner element 56, and the beam splitter 57, and enters the laser light concentrating optical system 60. The main pulse laser light 31*b* that has entered the laser light transmission device 50 is reflected by the first reflection control mirror 52, the second reflection control mirror 59, and the high reflection mirror 55, is transmitted through the combiner element 56, reflected by the beam splitter 57, and enters the laser light concentrating optical system 60.

The prepulse laser light 31*a* transmitted through the beam splitter 57 enters the beam sensor 70, is reflected by the beam splitter 71, and is incident on the beam splitter 81. A part of the prepulse laser light 31*a* is transmitted through the beam splitter 81 and enters the first position sensor 83, and the other part is reflected by the beam splitter 81 and enters the first angle sensor 84. The first position sensor 83 measures the position of the optical axis of the prepulse laser light 31*a*, and outputs the measurement value to the EUV light generation processor 5*a*. The first angle sensor 84 measures the angle of the optical axis of the prepulse laser light 31*a*, and outputs the measurement value to the EUV light generation processor 5*a*.

The main pulse laser light 31*b* transmitted through the beam splitter 57 enters the beam sensor 70, is transmitted through the beam splitter 71, and is incident on the beam splitter 82. A part of the main pulse laser light 31*b* is transmitted through the beam splitter 82 and enters the second position sensor 85, and the other part is reflected by the beam splitter 82 and enters the second angle sensor 86. The second position sensor 85 measures the position of the optical axis of the main pulse laser light 31*b*, and outputs the measurement value to the EUV light generation processor 5*a*. The second angle sensor 86 measures the angle of the optical axis of the main pulse laser light 31*b*, and outputs the measurement value to the EUV light generation processor 5*a*.

The EUV light generation processor 5*a* controls the angle of the first reflection control mirror 51 so that the position of the optical axis measured by the first position sensor 83 becomes the first target value, and controls the angle of the second reflection control mirror 58 so that the angle of the optical axis measured by the first angle sensor 84 becomes the second target value. As described above, in the present embodiment, the position of the optical axis of the prepulse laser light 31*a* is adjusted by the first reflection control mirror 51 on the upstream side, and the angle of the optical axis of the prepulse laser light 31*a* is adjusted by the second reflection control mirror 58 on the downstream side.

The EUV light generation processor 5*a* controls the angle of the first reflection control mirror 52 so that the position of the optical axis measured by the second position sensor 85 becomes the first target value, and controls the angle of the second reflection control mirror 59 so that the angle of the optical axis measured by the second angle sensor 86 becomes the second target value. As described above, in the present embodiment, the position of the optical axis of the main pulse laser light 31*b* is adjusted by the first reflection control mirror 52 on the upstream side, and the angle of the optical axis of the main pulse laser light 31*b* is adjusted by the second reflection control mirror 59 on the downstream side.

The EUV light generation processor 5*a* changes the angles of the first reflection control mirrors 51, 52 and the second reflection control mirrors 58, 59 at regular intervals.

Figure 12:
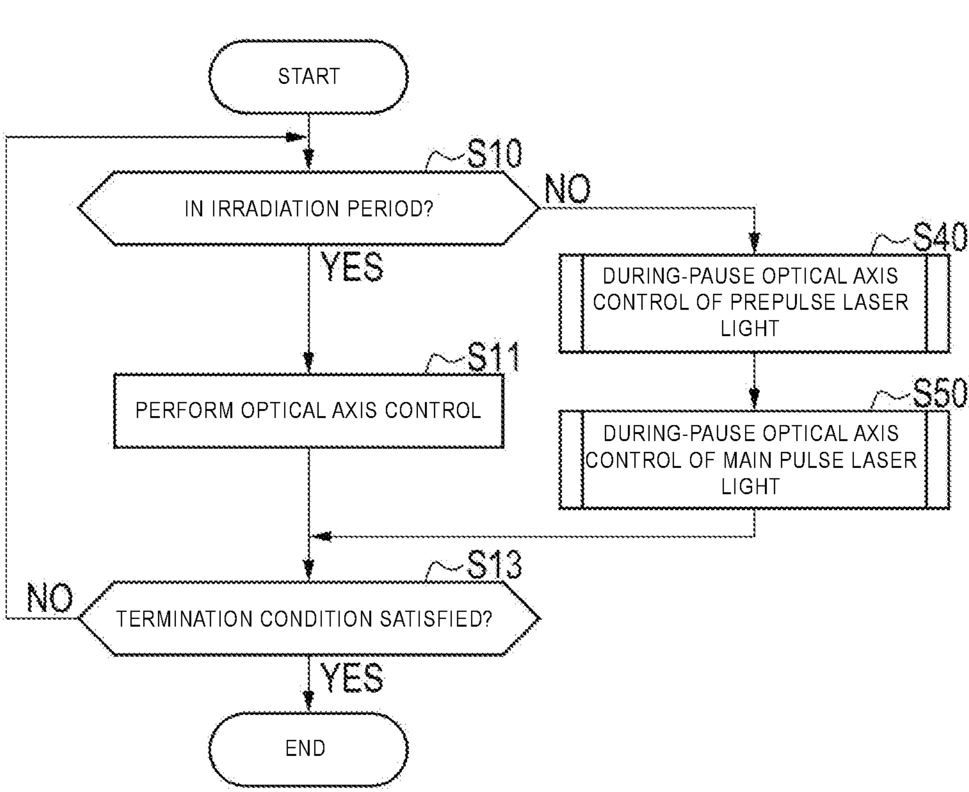
FIG. 12 is a flowchart showing the flow of the optical axis control according to the second embodiment.

FIG. 12 shows the flow of the optical axis control according to the second embodiment. The optical axis control according to the second embodiment differs from the first embodiment in that the position and the angle of the optical axis are controlled in step S11. In the optical axis control according to the second embodiment, the EUV light generation processor 5*a* performs steps S40, S50 instead of steps S20, S30 shown in FIG. 6.

Figure 13:
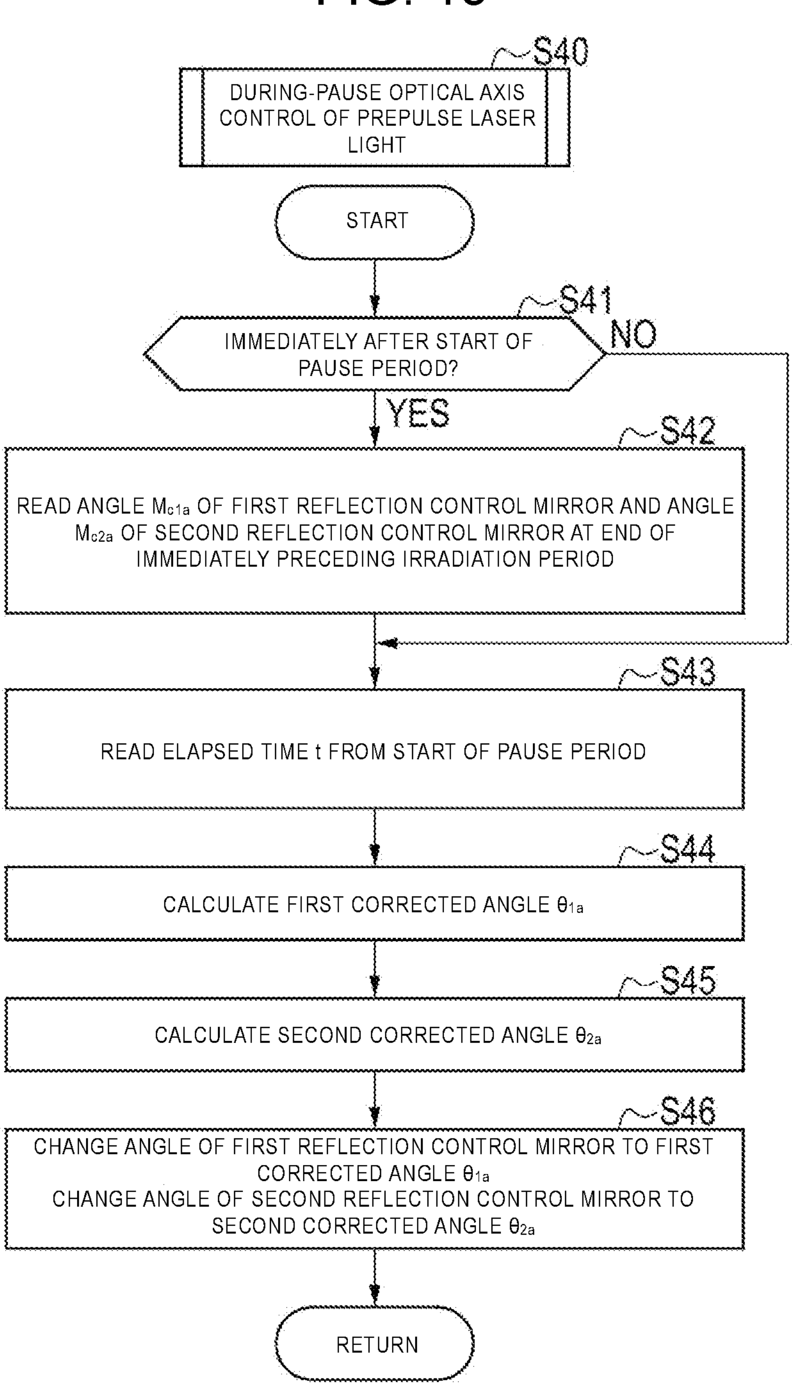
FIG. 13 is a flowchart showing the flow of during-pause optical axis control of the prepulse laser light.

FIG. 13 shows the flow of the during-pause optical axis control of the prepulse laser light 31*a*. In step S41, the EUV light generation processor 5*a* determines whether or not the current time point is immediately after the start of the pause period TB. When the EUV light generation processor 5*a* determines that it is immediately after the start of the pause period TB, processing proceeds to step S42. When the EUV light generation processor 5*a* determines that it is not immediately after the start of the pause period TB, processing proceeds to step S43.

In step S42, the EUV light generation processor 5*a* reads the angle $M_{c1a}$ of the first reflection control mirror 51 and the angle $M_{c2a}$ of the second reflection control mirror 58 at the end of the immediately preceding irradiation period TA. In step S43, the EUV light generation processor 5*a* reads the elapsed time t from the start of the pause period TB from the timer.

In step S44, the EUV light generation processor 5*a* calculates the corrected angle $\theta_{1a}$ by applying the angle $M_{c1a}$ read in step S42 and the elapsed time t read in step S43 to the first attenuation curve expressed by the above expression (1) described in the first embodiment. Hereinafter, the corrected angle $\theta_{1a}$ is referred to as a "first corrected angle $\theta_{1a}$", and the time constant $\tau_{1a}$ is referred to as a "first time constant $\tau_{1a}$." The first time constant $\tau_{1a}$ is a time constant related to the position change of the optical axis calculated using the measurement value by the first position sensor 83.

In step S45, the EUV light generation processor 5*a* calculates a second corrected angle $\theta_{2a}$ by applying the angle $M_{c2a}$ read in step S42 and the elapsed time t read in step S43 to a second attenuation curve expressed by the following expression (9).

[Expression 9]

$$\theta_{2a} = M_{c2a} + (M_{i2a} - M_{c2a}) \times \left(1 - e^{-t/\tau_{2a}}\right) \tag{9}$$

Here, $M_{i2a}$ is the angle of the second reflection control mirror 58 in the cold state. Further, $\tau_{2a}$ is a second time constant obtained by the above-described method. The second time constant $\tau_{2a}$ is a time constant related to the angle change of the optical axis calculated using the measurement value by the first angle sensor 84. The above expression (9) is an attenuation curve corresponding to the angle change in the optical axis of the prepulse laser light 31*a* in the pause period TB.

In step S46, the EUV light generation processor 5*a* changes the angle of the first reflection control mirror 51 to the first corrected angle $\theta_{1a}$, and changes the angle of the second reflection control mirror 58 to the second corrected angle $\theta_{1a}$.

Figure 14:
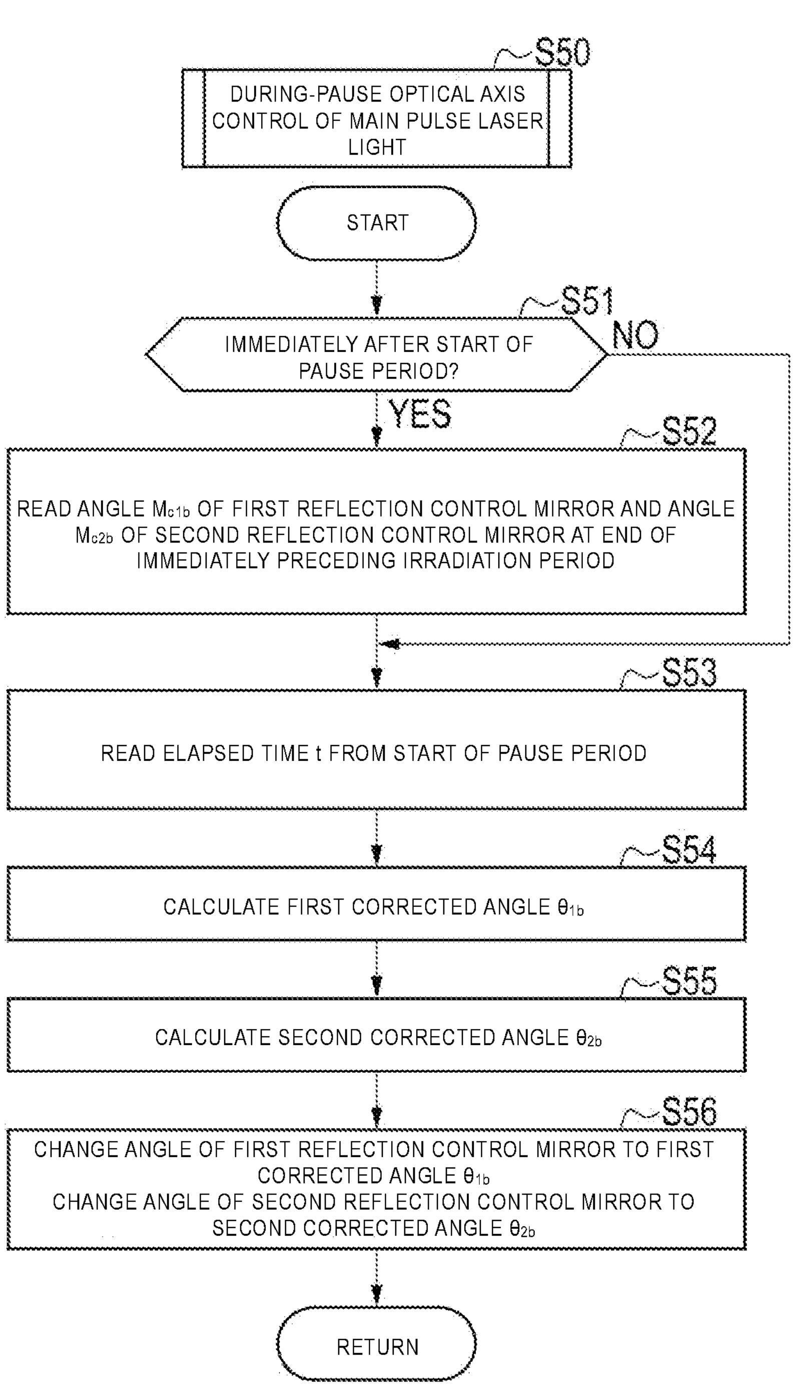
FIG. 14 is a flowchart showing the flow of the during-pause optical axis control of the main pulse laser light.

FIG. 14 shows the flow of the during-pause optical axis control of the main pulse laser light 31*b*. In steps S51 to S56 shown in FIG. 8, processes similar to steps S41 to S46 shown in FIG. 13 are performed.

In step S52, the EUV light generation processor 5*a* reads the angle Mat, of the first reflection control mirror 52 and the angle Mat, of the second reflection control mirror 59 at the end of the immediately preceding irradiation period TA.

In step S54, the EUV light generation processor 5*a* calculates the corrected angle bib by applying the angle Mat, read in step S52 and the elapsed time t read in step S53 to the first attenuation curve expressed by the above expression (2) described in the first embodiment. Hereinafter, the corrected angle $\theta_{1b}$ is referred to as a "first corrected angle $\theta_{1b}$", and the time constant $\tau_{1b}$ is referred to as a "first time constant $\tau_{1b}$." The first time constant $\tau_{1b}$ is a time constant related to the position change of the optical axis calculated using the measurement value by the second position sensor 85.

In step S55, the EUV light generation processor 5*a* calculates a second corrected angle $\theta_{2b}$ by applying the angle Mat, read in step S52 and the elapsed time t read in step S53 to a second attenuation curve expressed by the following expression (10).

[Expression 10]

$$\theta_{2b} = M_{c2b} + (M_{i2b} - M_{c2b}) \times \left(1 - e^{-t/\tau_{2b}}\right) \tag{10}$$

Here, $M_{i2b}$ is the angle of the second reflection control mirror 59 in the cold state. Further, $\tau_{2b}$ is the second time constant obtained by the above-described method. The second time constant $\tau_{2b}$ is a time constant related to the angle change of the optical axis calculated using the measurement value by the second angle sensor 86. The above expression (10) is an attenuation curve corresponding to the angle change in the optical axis of the main pulse laser light 31*b* in the pause period TB.

4.3 Effect

FIG. 15 explains the effect of the EUV light generation system 11 according to the second embodiment. For convenience of explanation, FIG. 15 shows only the optical axis control and the during-pause optical axis control of the prepulse laser light 31*a*. The same applies to the optical axis control and the during-pause optical axis control of the main pulse laser light 31*b*.

In the present embodiment, in the irradiation period TA, the angles of the first reflection control mirrors 51, 52 are controlled so as to correct the deviation of the position and the angle of the optical axis caused by the thermal load deformation from the target value, and the optical axis control for controlling the angles of the second reflection control mirrors 58, 59 is performed.

When the irradiation period TA ends and shifts to the pause period TB, the EUV light generation processor 5*a* performs the during-pause optical axis control for changing the angles of the first reflection control mirrors 51, 52 and the second reflection control mirrors 58, 59 so as to cancel out the change in the position and the angle of the optical axis caused by the revert of the thermal load deformation.

Then, when the pause period TB ends and shifts to the irradiation period TA, the irradiation is restarted. In the present embodiment, since the during-pause optical axis control for canceling out the change in the position and the angle of the optical axis is performed during the pause period TB, the primary target and the secondary target can be appropriately irradiated with the prepulse laser light 31*a* and the main pulse laser light 31*b*, and the EUV light 33 can be generated more stably immediately after the restart of the irradiation.

Here, a modification similar to the modification of the first embodiment can also be applied to the second embodiment. As a result, it is possible to reduce the approximation error between the first attenuation curve and the second attenuation curve, and thus it is possible to generate the EUV light 33 more stably immediately after the restart of the irradiation.

5. Others

Figure 16:
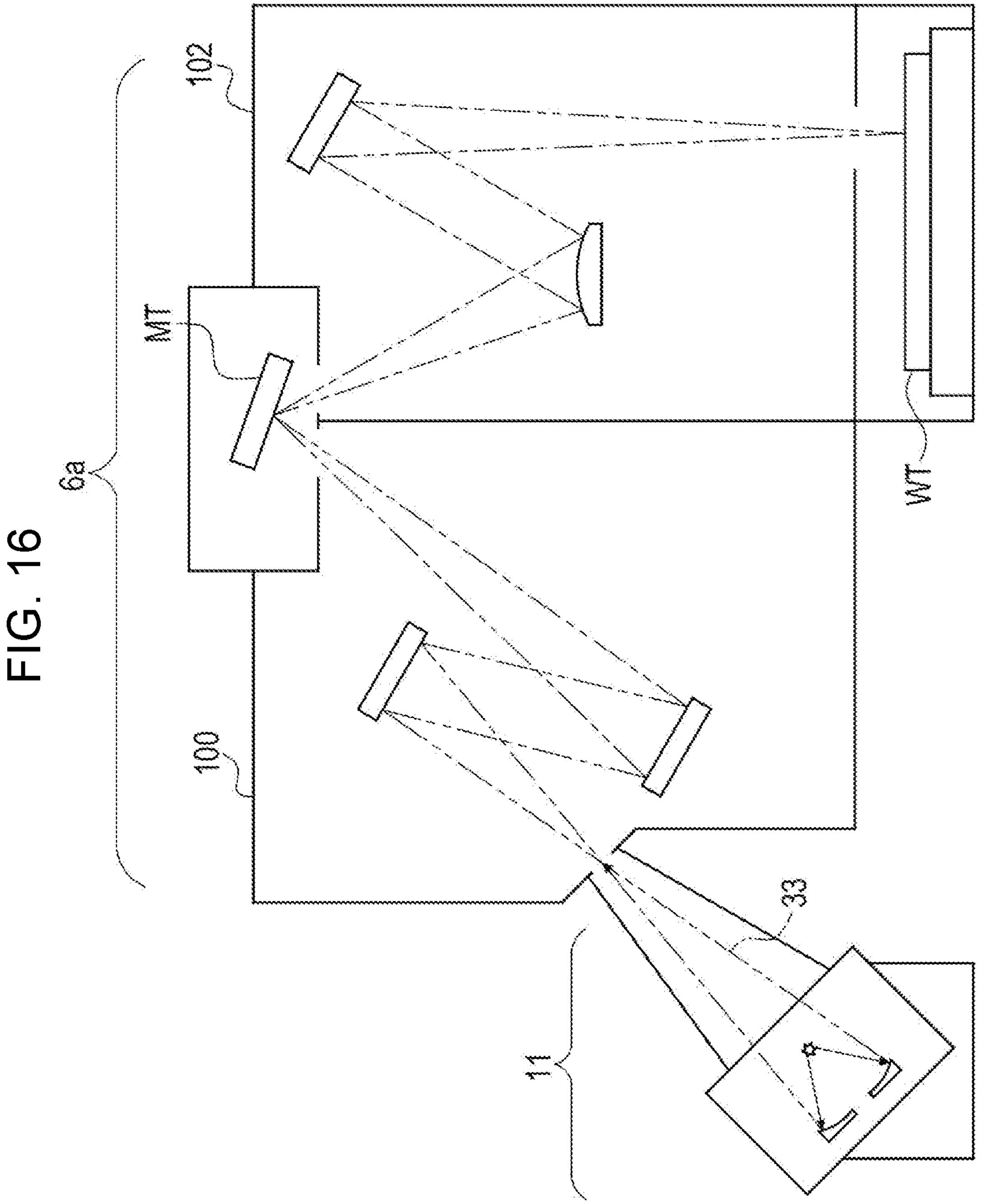
FIG. 16 schematically shows the configuration of an exposure apparatus connected to the EUV light generation system.

FIG. 16 schematically shows the configuration of an exposure apparatus 6*a* connected to the EUV light generation system 11. In FIG. 16, the exposure apparatus 6*a* as the external apparatus 6 includes a mask irradiation unit 100 and a workpiece irradiation unit 102. The mask irradiation unit 100 illuminates, via a reflection optical system, a mask pattern of a mask table MT with the EUV light 33 incident from the EUV light generation system 11. The workpiece irradiation unit 102 images the EUV light 33 reflected by the mask table MT onto a workpiece (not shown) arranged on the workpiece table WT via a reflection optical system. The workpiece is a photosensitive substrate such as a semiconductor wafer on which photoresist is applied. The exposure apparatus 6*a* synchronously translates the mask table MT and the workpiece table WT to expose the workpiece to the EUV light 33 reflecting the mask pattern. Through the exposure process as described above, a device pattern is transferred onto the semiconductor wafer, thereby an electronic device can be manufactured.

Figure 17:
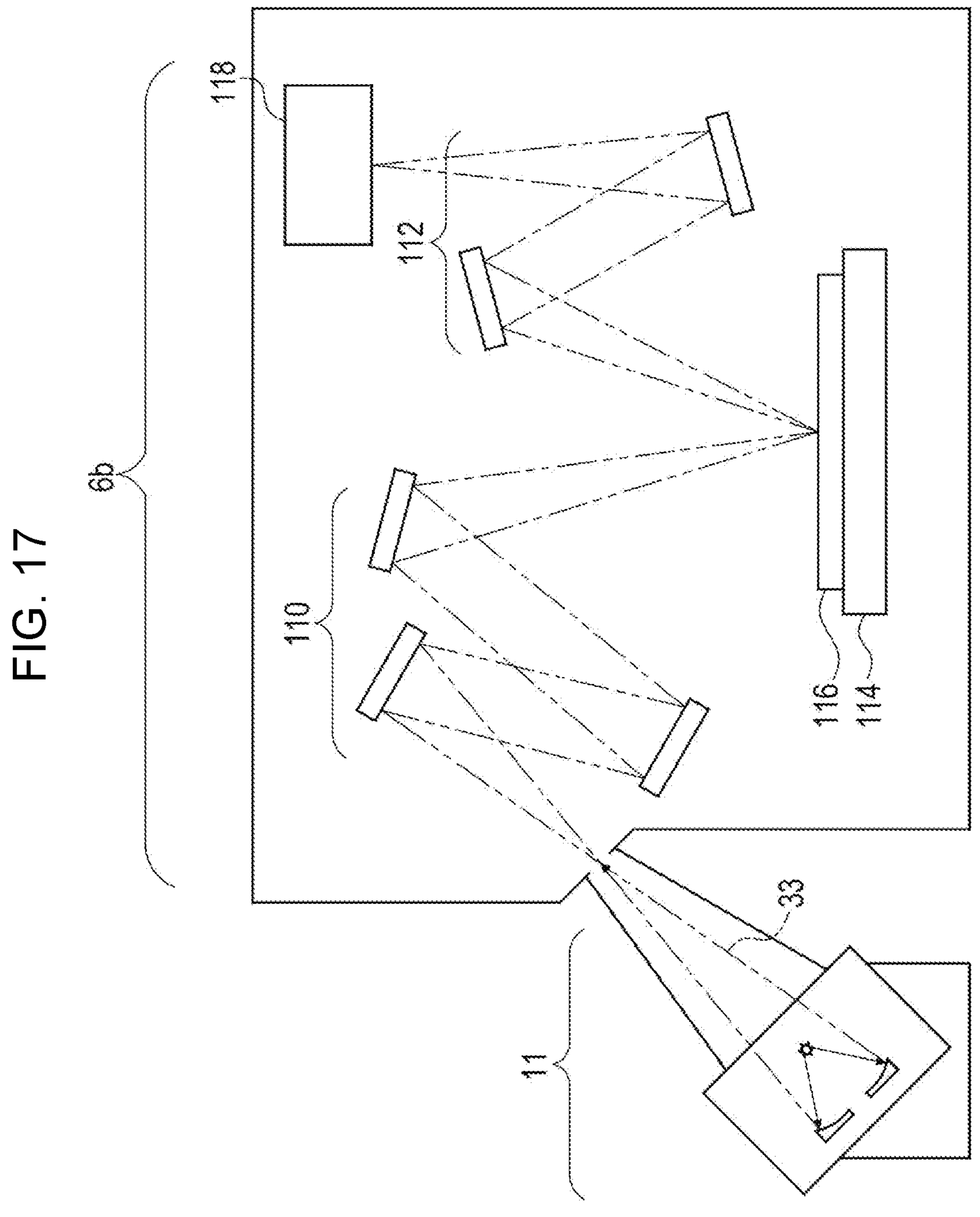
FIG. 17 schematically shows the configuration of an inspection apparatus connected to the EUV light generation system.

FIG. 17 schematically shows the configuration of an inspection apparatus 6*b* connected to the EUV light generation system 11. In FIG. 17, the inspection apparatus 6*b* as the external apparatus 6 includes an illumination optical system 110 and a detection optical system 112. The EUV light generation system 11 outputs, as a light source for inspection, the EUV light 33 to the inspection apparatus 6*b*. The illumination optical system 110 reflects the EUV light 33 incident from the EUV light generation system 11 to illuminate a mask 116 placed on a mask stage 114. Here, the mask 116 conceptually includes a mask blanks before a pattern is formed. The detection optical system 112 reflects the EUV light 33 from the illuminated mask 116 and forms an image on a light receiving surface of a detector 118. The detector 118 having received the EUV light 33 obtains an image of the mask 116. The detector 118 is, for example, a time delay integration (TDI) camera. A defect of the mask 116 is inspected based on the image of the mask 116 obtained by the above-described process, and a mask suitable for manufacturing an electronic device is selected using the inspection result. Then, the electronic device can be manufactured by exposing and transferring the pattern formed on the selected mask onto the photosensitive substrate using the exposure apparatus 6*a*.

The description above is intended to be illustrative and the present disclosure is not limited thereto. Therefore, it would be obvious to those skilled in the art that various modifications to the embodiments of the present disclosure would be possible without departing from the spirit and the scope of the appended claims.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. An extreme ultraviolet (EUV) light generation system configured to generate EUV light by irradiating a target with pulse laser light to turn the target into plasma, the EUV light generation system comprising:

a chamber;

a target supply device configured to supply the target to a plasma generation region in the chamber;

a laser device configured to output the pulse laser light;

a beam sensor configured to measure one of a position and an angle of an optical axis of the pulse laser light as a first optical characteristic;

a first reflection control mirror whose angle is controlled so that the first optical characteristic becomes a first target value; and a processor configured to control the laser device so that the target is irradiated with the pulse laser light;

the processor being configured to repeatedly calculate, at a plurality of time points, a first corrected angle based on a first attenuation curve defined by the angle of the first reflection control mirror at an end of an immediately preceding irradiation period, the angle of the first reflection control mirror at a cold state, an elapsed time from a start of the pause period, and a first time constant, and to repeatedly change the angle of the first reflection control mirror to the first corrected angle, during a pause period in which output of the pulse laser light is stopped, wherein, assuming that the angle of the first reflection control mirror at the end of the immediately preceding irradiation period is $M_{c1}$, the angle of the first reflection control mirror at the cold state is $M_{i1}$, the elapsed time is t, the first time constant is $\tau_1$, and the first corrected angle is θ1, the first attenuation curve is expressed by the following expression (1).

[Expression 1]

$$\theta_1 = M_{c1} + (M_{i1} - M_{c1}) \times (1 - e^{-t/\tau_1}). \quad (1)$$

2. The EUV light generation system according to claim 1, wherein the pulse laser light includes prepulse laser light.

3. The EUV light generation system according to claim 1, wherein the pulse laser light includes main pulse laser light.

4. The EUV light generation system according to claim 1, wherein the processor changes the angle of the first reflection control mirror at regular intervals.

5. The EUV light generation system according to claim 1, wherein the beam sensor is configured to measure the other of the position and the angle of the optical axis as a second optical characteristic in addition to the first optical characteristic, a second reflection control mirror is configured to have an angle thereof controlled so that the second optical characteristic becomes a second target value is comprised on a downstream side in a propagation direction of the pulse laser light with respect to the first reflection control mirror, and the processor is configured to calculate a second corrected angle based on a second attenuation curve defined by the angle of the second reflection control mirror at the end of the immediately preceding irradiation period, the angle of the second reflection control mirror at the cold state, the elapsed time, and a second time constant, and to change the angle of the second reflection control mirror to the second corrected angle, during the pause period.

6. The EUV light generation system according to claim 5, wherein the first optical characteristic is the position of the optical axis and the second optical characteristic is the angle of the optical axis.

7. The EUV light generation system according to claim 5, wherein the pulse laser light includes prepulse laser light.

8. The EUV light generation system according to claim 5, wherein the pulse laser light includes main pulse laser light.

9. The EUV light generation system according to claim 5, wherein the processor changes the angle of the second reflection control mirror at regular intervals.

10. The EUV light generation system according to claim 5, wherein, assuming that the angle of the second reflection control mirror at the end of the immediately preceding irradiation period is $M_{c2}$, the angle of the second reflection control mirror at the cold state is $M_{i2}$, the elapsed time is t, the second time constant is τ2, and the second corrected angle is $\theta_2$, the second attenuation curve is expressed by the following expression (3).

[Expression 3]

$$\theta_2 = M_{c2} + (M_{i2} - M_{c2}) \times (1 - e^{-t/\tau_2}). \quad (3)$$

11. The EUV light generation system according to claim 5, wherein the beam sensor measures the first optical characteristic and the second optical characteristic of the pulse laser light immediately before entering the chamber.

12. The EUV light generation system according to claim 1, wherein the beam sensor measures the first optical characteristic of the pulse laser light immediately before entering the chamber.

13. An extreme ultraviolet (EUV) light generation system configured to generate EUV light by irradiating a target with pulse laser light to turn the target into plasma, the EUV light generation system comprising:

a chamber;

a target supply device configured to supply the target to a plasma generation region in the chamber;

a laser device configured to output the pulse laser light;

a beam sensor configured to measure one of a position and an angle of an optical axis of the pulse laser light as a first optical characteristic;

a first reflection control mirror whose angle is controlled so that the first optical characteristic becomes a first target value; and a processor configured to control the laser device so that the target is irradiated with the pulse laser light;

the processor being configured to repeatedly calculate, at a plurality of time points, a first corrected angle based on a first attenuation curve defined by the angle of the first reflection control mirror at an end of an immediately preceding irradiation period, the angle of the first reflection control mirror at a cold state, an elapsed time from a start of the pause period, and a first time constant, and to repeatedly change the angle of the first reflection control mirror to the first corrected angle, during a pause period in which output of the pulse laser light is stopped, wherein the first time constant includes a plurality of time constants $\tau_{1i}$, and assuming that the angle of the first reflection control mirror at the end of the immediately preceding irradiation period is $M_{c1}$, the angle of the first reflection control mirror at the cold state is $M_{i1}$, the elapsed time is t, the first corrected angle is θ1, and a contribution coefficient of the time constant $\tau_{1i}$ is $C_i$, the first attenuation curve is expressed by the following expression (2)

[Expression 2]

$$\theta_1 = M_{c1} + (M_{i1} - M_{c1}) \times \left(1 - \sum_{i=1}^{n} C_i e^{-t/\tau_{1i}}\right). \quad (2)$$

14. An extreme ultraviolet (EUV) light generation system configured to generate EUV light by irradiating a target with pulse laser light to turn the target into plasma, the EUV light generation system comprising:

a chamber;

a target supply device configured to supply the target to a plasma generation region in the chamber;

a laser device configured to output the pulse laser light;

a beam sensor configured to measure one of a position and an angle of an optical axis of the pulse laser light as a first optical characteristic;

a first reflection control mirror whose angle is controlled so that the first optical characteristic becomes a first target value; and a processor configured to control the laser device so that the target is irradiated with the pulse laser light;

the processor being configured to calculate a first corrected angle based on a first attenuation curve defined by the angle of the first reflection control mirror at an end of an immediately preceding irradiation period, the angle of the first reflection control mirror at a cold state, an elapsed time from a start of the pause period, and a first time constant, and to change the angle of the first reflection control mirror to the first corrected angle, during a pause period in which output of the pulse laser light is stopped, wherein, assuming that the angle of the first reflection control mirror at the end of the immediately preceding irradiation period is $M_{c1}$, the angle of the first reflection control mirror at the cold state is $M_{i1}$, the elapsed time is t, the first time constant is $\tau_1$, and the first corrected angle is $\theta_1$, the first attenuation curve is expressed by the following expression (1),

[Expression 1]

$$\theta_1 = M_{c1} + (M_{i1} - M_{c1}) \times \left(1 - e^{-t/\tau_1}\right). \qquad (1)$$

* * * * *